US012568852B2

(12) United States Patent
Bae et al.

(10) Patent No.: US 12,568,852 B2
(45) Date of Patent: Mar. 3, 2026

(54) DISPLAY DEVICE

(71) Applicant: Samsung Display Co., LTD., Yongin-si (KR)

(72) Inventors: Sung Geun Bae, Hwaseong-si (KR); Jeong Hyun Lee, Asan-si (KR); Jong Chan Lee, Suwon-si (KR); Jin Woo Lee, Suwon-si (KR); Da Sol Jeong, Seoul (KR); Kyung Ah Choi, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 940 days.

(21) Appl. No.: 17/544,149

(22) Filed: Dec. 7, 2021

(65) Prior Publication Data

US 2022/0328465 A1     Oct. 13, 2022

(30) Foreign Application Priority Data

Apr. 8, 2021     (KR) ........................ 10-2021-0045750

(51) Int. Cl.
H01L 25/16        (2023.01)
H10H 20/853       (2025.01)
(Continued)

(52) U.S. Cl.
CPC ......... H01L 25/167 (2013.01); H10H 20/853 (2025.01); *H01L 24/24* (2013.01);
(Continued)

(58) Field of Classification Search
CPC .. H10K 50/844; H10K 59/131; H10K 77/111; H10K 50/805; H10K 50/852;
(Continued)

(56) References Cited

U.S. PATENT DOCUMENTS

2020/0005703 A1*     1/2020     Kim ......................... G09G 3/32
2020/0013766 A1     1/2020     Kim
(Continued)

FOREIGN PATENT DOCUMENTS

JP          2021-12251          2/2021
KR     10-2020-0005692          1/2020
(Continued)

OTHER PUBLICATIONS

International Search Report corresponding to International Application No. PCT/KR2022/002986 dated Jun. 17, 2022.
(Continued)

*Primary Examiner* — Moin M Rahman
(74) *Attorney, Agent, or Firm* — Womble Bond Dickinson (US) LLP

(57) ABSTRACT

A display device includes first and second electrodes disposed on a substrate, the first and second electrodes extending in a direction and being parallel to each other, a first insulating layer disposed on the first and second electrodes, light-emitting elements disposed on the first insulating layer, the light-emitting elements having first end portions disposed on the first electrode and second end portions disposed on the second electrode, and a partition disposed on the first insulating layer and being parallel to the first electrode, the partition including a first part that overlaps the light-emitting elements, and second parts that do not overlap the light-emitting elements, wherein a vertical distance from a top surface of the first electrode to a top surface of the first part is equal to a vertical distance from the top surface of the first electrode to top surfaces of the second parts.

13 Claims, 30 Drawing Sheets

T1 : ACT,G1,SE,DE
RME: RME1, RME2
CNE: CNE1, CNE2
WAV: WAV1, WAV2

(51) Int. Cl.
*H01L 23/00* (2006.01)
*H10H 20/01* (2025.01)

(52) U.S. Cl.
CPC .... *H01L 24/95* (2013.01); *H01L 2224/24147* (2013.01); *H01L 2224/95102* (2013.01); *H01L 2224/95145* (2013.01); *H10H 20/0362* (2025.01)

(58) Field of Classification Search
CPC .. H10K 50/856; H10K 59/12; H10K 50/8445; H10K 50/85; H10K 59/10; H10K 59/129; H10K 2101/00; H10K 2102/311; H10K 2102/361; H10K 71/00; H10K 59/35; H10K 50/11; H10K 50/156; H10K 85/615; H10K 85/624; H10K 85/626; H10K 85/631; H10K 85/633; H10K 85/636; H10K 85/6572; H10K 2101/30; H10K 2101/40; H10K 50/155; H10K 50/115; H10K 50/13; H10K 50/80; H10K 85/6574; H10K 59/873; H10K 2102/36; G02F 1/133305; G02F 1/133388; G02F 1/13452; G02F 1/136254; G02F 2201/50; G02F 2202/28; H01L 2224/73204; H01L 25/0753; H01L 24/75; H01L 24/98; H01L 2221/68322; H01L 2221/68354; H01L 2224/75822; H01L 2224/7598; H01L 2924/12041; H01L 21/6835; H01L 24/95; Y02E 10/549; G09G 2300/0426; H10H 20/01; H10H 20/821; H10H 20/857; H10H 20/0145; H10H 20/826–8262; H10H 20/013–0137; H10H 20/824–8252; H10H 20/012–0125; H10H 20/823–8232; H10H 20/0165; H10H 20/817–818; H10H 20/052; H10H 20/814–8142
See application file for complete search history.

(56) References Cited

U.S. PATENT DOCUMENTS

| | | | |
|---|---|---|---|
| 2020/0176656 A1 | 6/2020 | Bae et al. | |
| 2020/0212267 A1 | 7/2020 | Kwak et al. | |
| 2021/0005583 A1 | 1/2021 | Iguchi et al. | |
| 2021/0305222 A1 | 9/2021 | Min et al. | |
| 2021/0305225 A1 | 9/2021 | Kim | |
| 2022/0181582 A1* | 6/2022 | Nomiyama | H05B 33/10 |

FOREIGN PATENT DOCUMENTS

| | | |
|---|---|---|
| KR | 10-2020-0006209 | 1/2020 |
| KR | 10-2020-0068150 | 6/2020 |
| KR | 10-2020-0079817 | 7/2020 |
| KR | 10-2022-0021949 | 2/2022 |

OTHER PUBLICATIONS

Written Opinion corresponding to International Application No. PCT/KR2022/002986, dated Jun. 17, 2022.

* cited by examiner

10

NDA

DPA

DR2

DR1

DR3

WLC1      WLC2      LTU

CF1  BS1  SCT1  WLS1  CF2  BS2  SCT2  WLS2  CF3  BS3  SCT3

~ TFE

PRT ⎫
BK2 ⎭ CFL

~ 43 ⎫
~ CAP2 ⎪
⎬ WLCL
~ BK1 ⎪
~ CAP1 ⎭

~ 41

EML {

WA   ED
SE  G1 ▶DE

~ BNL
~ 19

TFTL {

~ 17
~ 15
~ 13
~ 12

~ 11

BML  ACTa  ACTc  ACTb

ACT

BA1  LA1  BA2  LA2  BA3  LA3  BA1

DR3
↑
⊗→ DR1
DR2

T1: ACT, G1, SE, DE
LA: LA1, LA2, LA3

RME: RME1, RME2
CNE: CNE1, CNE2
WAV: WAV1, WAV2
WAH: WAH1, WAH2

SPX1

SA

ROP

RME1
CT1

Q4

RME2
CT2

Q4'

CTD

Q1

Q1' Q3

CTS

Q3'

WAH1

WAV1

WAV2

WAA

WA

BNL

ED

Q2

Q2'

CNE2

CNE1

EMA

WAH2

DR2

DR1

DR3

RME: RME1, RME2
CNE: CNE1, CNE2
WAV: WAV1, WAV2
WAH: WAH1, WAH2

FIG. 6

T1 : ACT,G1,SE,DE
RME: RME1, RME2
CNE: CNE1, CNE2
WAV: WAV1, WAV2

T1 : ACT,G1,SE,DE
RME: RME1, RME2
CNE: CNE1, CNE2
WAV: WAV1, WAV2

T1 : ACT,G1,SE,DE
RME: RME1, RME2
CNE: CNE1, CNE2
WAV: WAV1, WAV2

FIG. 15

WAV: WAV1, WAV2

WAV: WAV1, WAV2
WAH: WAH1, WAH2

WAV: WAV1, WAV2

SPX1

SA

ROP

RME1
CT1

RME2
CT2

CTD

CTS

WAH1

BNL

WAV1

ED

WAV2

WAA

WA

Q5 ← ----- → Q5'

RFL

CNE2

CNE1

EMA

WAH2

DR2
DR1
DR3

RME: RME1, RME2
CNE: CNE1, CNE2
WAV: WAV1, WAV2
WAH: WAH1, WAH2

T1 : ACT,G1,SE,DE
RME: RME1, RME2
CNE: CNE1, CNE2
WAV: WAV1, WAV2

T1 : ACT,G1,SE,DE
RME: RME1, RME2
CNE: CNE1, CNE2
WAV: WAV1, WAV2

SPX1

SA

ROP

RME1
CT1

RME2
CT2

CTD

CTS

WAH1

WA

WAV1

WAV2

WAA

Q6

BNL

ED

RFL

CNE2

CNE1

EMA

WAH2

RME: RME1, RME2
CNE: CNE1, CNE2
WAV: WAV1, WAV2
WAH: WAH1, WAH2

SPX1

SA

ROP

RME1
CT1

RME2
CT2

CTD

CTS

BNL

WA { WAV1
WAV2

WAA

ED

CNE2

CNE1

EMA

RME: RME1, RME2
CNE: CNE1, CNE2
WAV: WAV1, WAV2

SPX1

SA

ROP

RME1
CT1

RME2
CT2

CTD

CTS

BNL

WAV1

ED

WA { WAV2

WAA

RFL

CNE2

CNE1

EMA

DR2
DR1
DR3

RME: RME1, RME2
CNE: CNE1, CNE2
WAV: WAV1, WAV2

RME: RME1, RME2, RME3, RME4
CNE: CNE1, CNE2, CNE3, CNE4, CNE5
ED: ED1, ED2, ED3, ED4
WA: WAA1, WAA2, WAV1, WAV2, WAV3, WAH1, WAH2
WAV: WAV1, WAV2, WAV3
WAH: WAH1, WAH2
WAA: WAA1, WAA2

RME: RME1, RME2, RME3, RME4
CNE: CNE1, CNE2, CNE3, CNE4
WAV: WAV1, WAV2, WAV3
WAA: WAA1, WAA2

RME: RME1, RME2, RME3, RME4
CNE: CNE1, CNE2, CNE3, CNE4

RME: RME1, RME2, RME3
CNE: CNE1, CNE2, CNE3
ED: ED1, ED2
WA: WAA1, WAA2, WAV1, WAV2, WAV3, WAH1, WAH2
WAV: WAV1, WAV2, WAV3
WAH: WAH1, WAH2
WAA: WAA1, WAA2

RME: RME1, RME2, RME3
CNE: CNE1, CNE2, CNE3
WAV: WAV1, WAV2, WAV3
WAA: WAA1, WAA2

DISPLAY DEVICE

CROSS-REFERENCE TO RELATED APPLICATION(S)

This application claims priority to and the benefit of Korean Patent Application No. 10-2021-0045750 under 35 U.S.C. § 119, filed in the Korean Intellectual Property Office (KIPO) on Apr. 8, 2021, the contents of which are incorporated herein by reference.

BACKGROUND

1. Technical Field

The disclosure relates to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

Typically, a display device, which displays an image, may include a display panel such as an OLED display panel or an LCD panel. The display panel, particularly, a light-emitting element display panel, includes light-emitting elements. For example, light-emitting diodes (LEDs) may include OLEDs using an organic material as a light-emitting material and inorganic light-emitting diodes (ILEDs) using an inorganic material as a light-emitting material.

SUMMARY

Embodiments of the disclosure provide a display device capable of improving luminance and reducing the number of mask processes and a method of fabricating the display device.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, the display device may comprise a first electrode and a second electrode disposed on a substrate, the first and second electrodes extending in a direction and being parallel to each other, a first insulating layer disposed on the first and second electrodes, light-emitting elements disposed on the first insulating layer, the light-emitting elements having first end portions disposed on the first electrode and second end portions disposed on the second electrode, and a partition disposed on the first insulating layer and being parallel to the first electrode, the partition including a first part that overlaps the light-emitting elements, and second parts that do not overlap the light-emitting elements. A vertical distance from a top surface of the first electrode to a top surface of the first part may be equal to a vertical distance from the top surface of the first electrode to top surfaces of the second parts.

In an embodiment, the second parts include a first extension and a second extension, the first and second extensions may be disposed adjacent to each other, and the light-emitting elements may be disposed between the first and second extensions.

In an embodiment, the first part may be disposed between the first and second extensions.

In an embodiment, the first extension may overlap the first electrode, and the second extension may overlap the second electrode.

In an embodiment, the first part and the second parts may intersect a direction in which the light-emitting elements extend.

In an embodiment, the partition may further include third parts that extend in a direction that intersects the first electrode and connect the first part and the second parts.

In an embodiment, the third parts may include a first connector disposed on a side of the first part, and a second connector disposed on another side of the first part.

In an embodiment, the first and second connectors may be arranged parallel to a direction in which the light-emitting elements extend, and do not overlap the light-emitting elements.

In an embodiment, the display device may further comprise a bank disposed on the first insulating layer and partitioning an emission area in which the light-emitting elements are disposed.

In an embodiment, the partition may be disposed in the emission area and does not overlap the bank.

In an embodiment, the vertical distance from the top surface of the first electrode to the top surface of the first part may be equal to a vertical distance from the top surface of the first electrode to a top surface of the bank.

In an embodiment, the vertical distance from the top surface of the first electrode to the top surface of the first part may be greater than the vertical distance from the top surface of the first electrode to the top surface of the bank.

In an embodiment, the bank and the first part and the second parts of the partition may be disposed directly on the first insulating layer and contact the first insulating layer.

According to an embodiment of the disclosure, the display device may comprise a first electrode and a second electrode disposed on a substrate, the first and second electrodes extending in a direction and being parallel to each other, a first insulating layer disposed on the first and second electrodes, light-emitting elements disposed on the first insulating layer, the light-emitting elements having first end portions disposed on the first electrode and second end portions disposed on the second electrode, a partition disposed on the first insulating layer and being parallel to the first electrode, the partition including a first part that overlaps the light-emitting elements, and second parts that do not overlap with the light-emitting elements, and reflective layers disposed at least on side surfaces of the second parts. A vertical distance from a top surface of the first electrode to a top surface of the first part may be equal to a vertical distance from the top surface of the first electrode to top surfaces of the second parts.

In an embodiment, the second parts may include a first extension and a second extension that are disposed adjacent to each other, the light-emitting elements may be disposed between the first and second extensions, and the reflective layers are disposed on a side surface of the first extension and a side surface of the second extension that are adjacent to the light-emitting elements.

In an embodiment, the reflective layers may face each other, and the light-emitting elements may be disposed between the reflective layers.

In an embodiment, the partition further includes third parts that extend in a direction that intersects the first electrode and connect the first part and the second parts.

In an embodiment, the third parts may include a first connector disposed on a side of the first part, and a second connector disposed on another side of the first part, and the reflective layers may extend along a side surface of the first connector and a side surface of the second connector.

In an embodiment, one of the reflective layers may overlap the first electrode, another one of the reflective layers may overlap the second electrode, and the reflective layers may be spaced apart from the first and second connectors.

In an embodiment, the first extension, the second extension, and the first part may be spaced apart from each other.

In an embodiment, the display device may further comprise a first connecting electrode disposed on the light-emitting elements, the first connecting electrode electrically contacting the first end portions of the light-emitting elements; and a second connecting electrode disposed on the light-emitting elements, the second connecting electrode electrically contacting the second end portions of the light-emitting elements.

According to the aforementioned and other embodiments of the disclosure, as a partition is disposed on electrodes and light-emitting elements, the volume of ink that can be applied onto the emission area of each subpixel can be increased. As a result, the number of light-emitting elements that can be aligned in the emission area of each subpixel can be increased, and thus, luminance can be improved.

Also, as the partition is formed via dry etching to have a large taper angle, the height of the partition can be reduced, and as a result, a cell gap can be reduced. Accordingly, a thin display device can be realized.

Also, as reflective layers are disposed on side surfaces of parts of the partition, light emitted by the light-emitting elements can be reflected in an upward direction, and thus, luminance can be improved.

Also, as the parts of the partition are formed at the same time by a single mask process, the number of mask processes can be reduced.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which:

FIG. 6 is a schematic cross-sectional view taken along lines Q1-Q1', Q2-Q2', and Q3-Q3' of FIG. 5;

4

Figure 10:
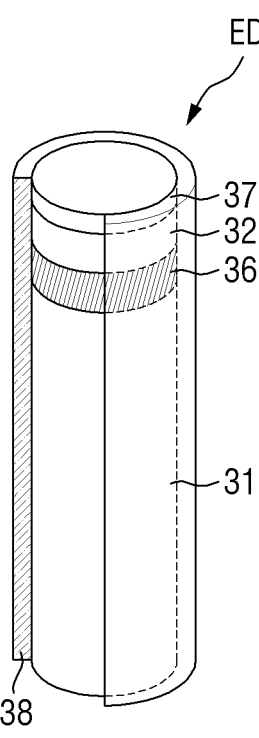
Figure 18:
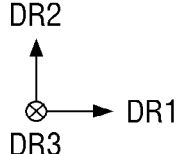
Figure 19:
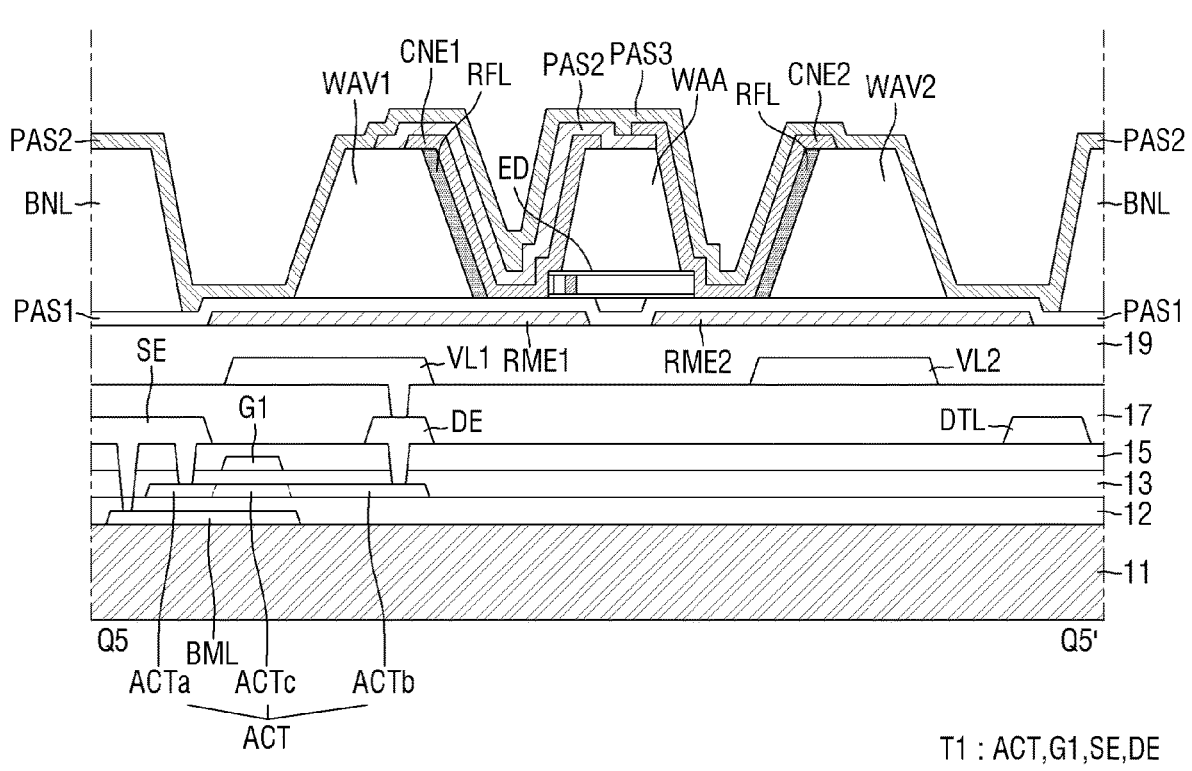
Figure 20:
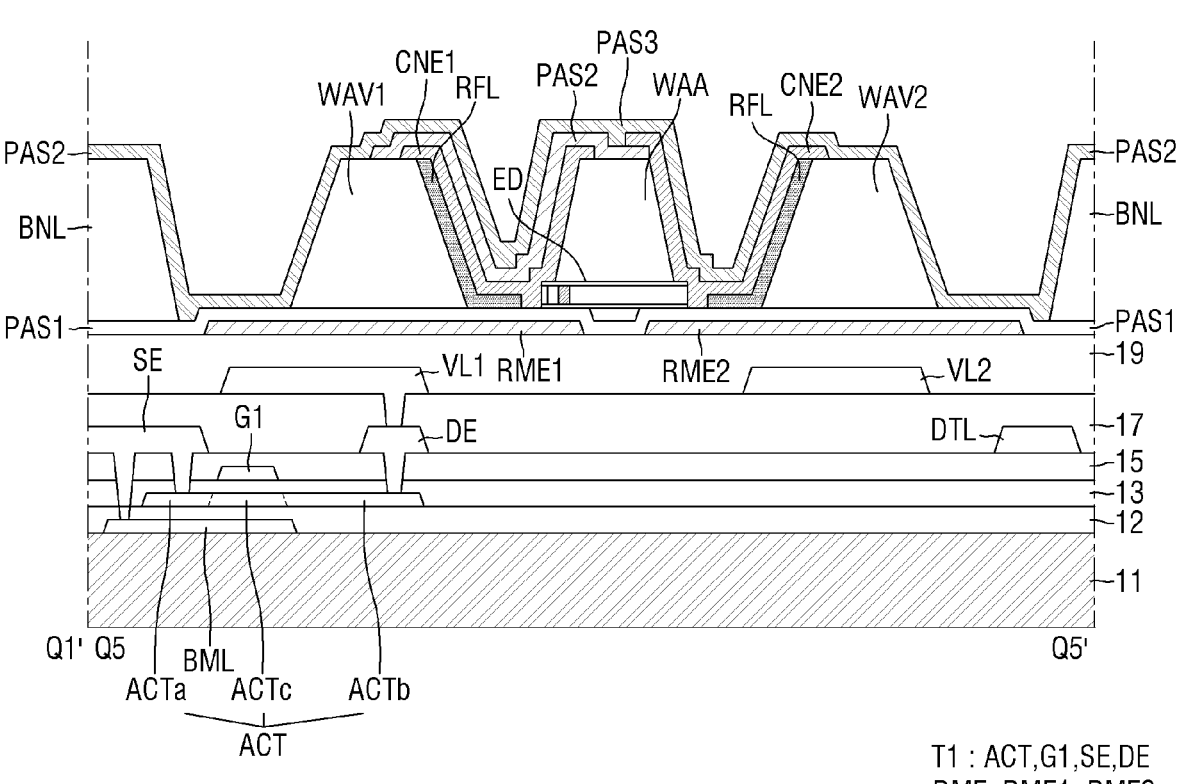
Figure 21:
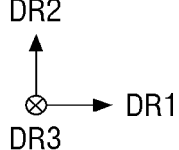
Figure 22:
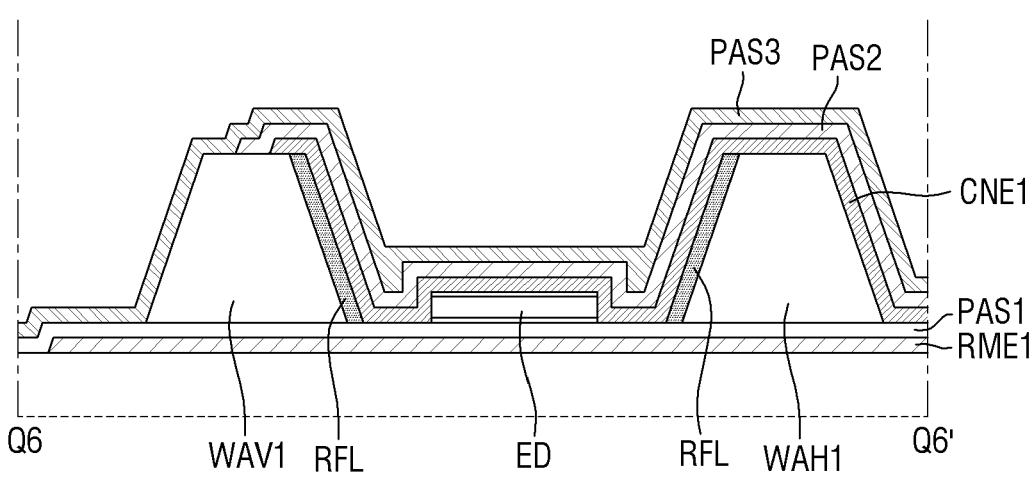
Figure 23:
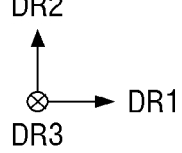
Figure 24:
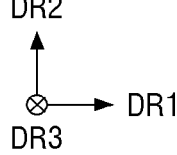
Figure 25:
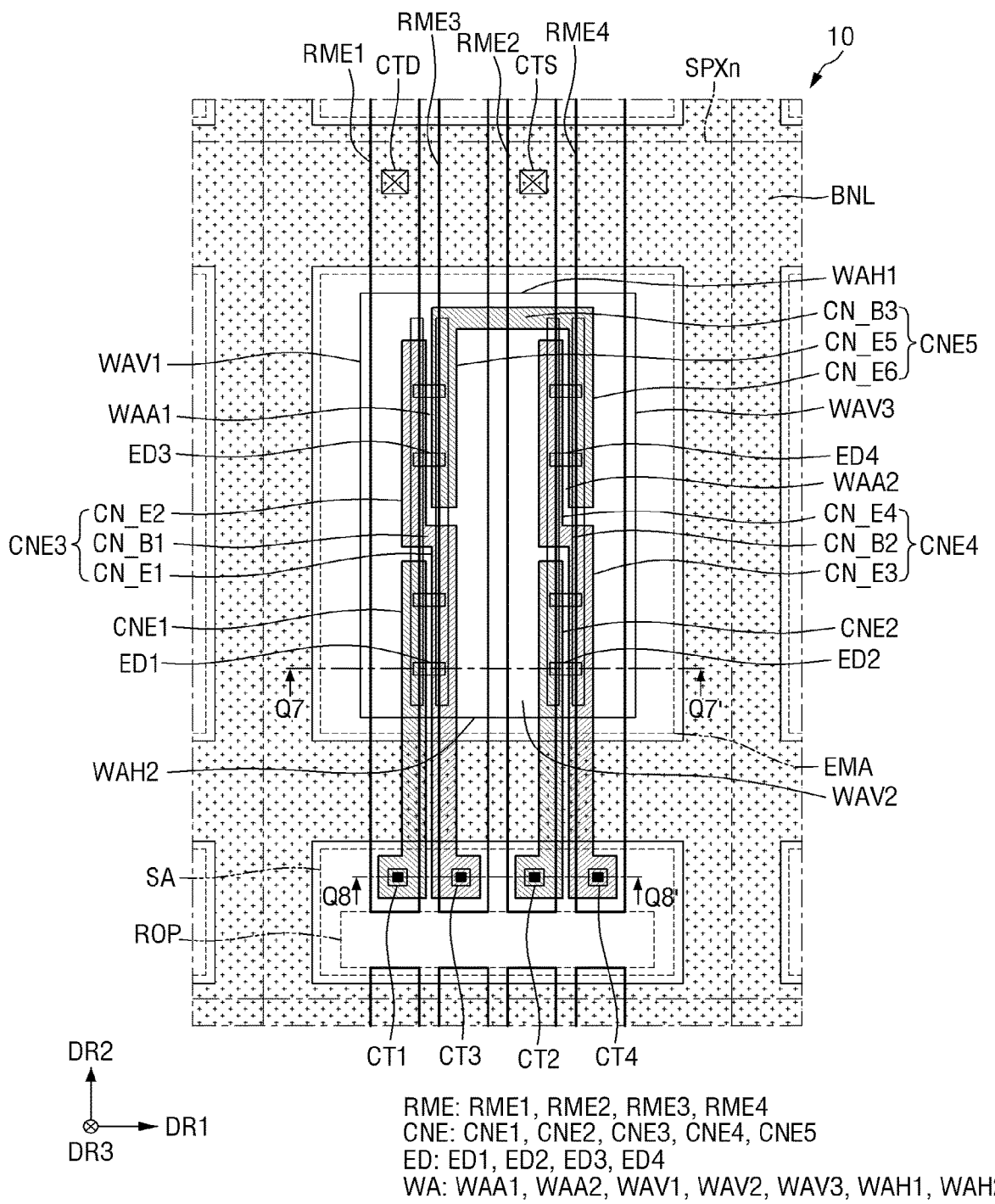
Figure 26:
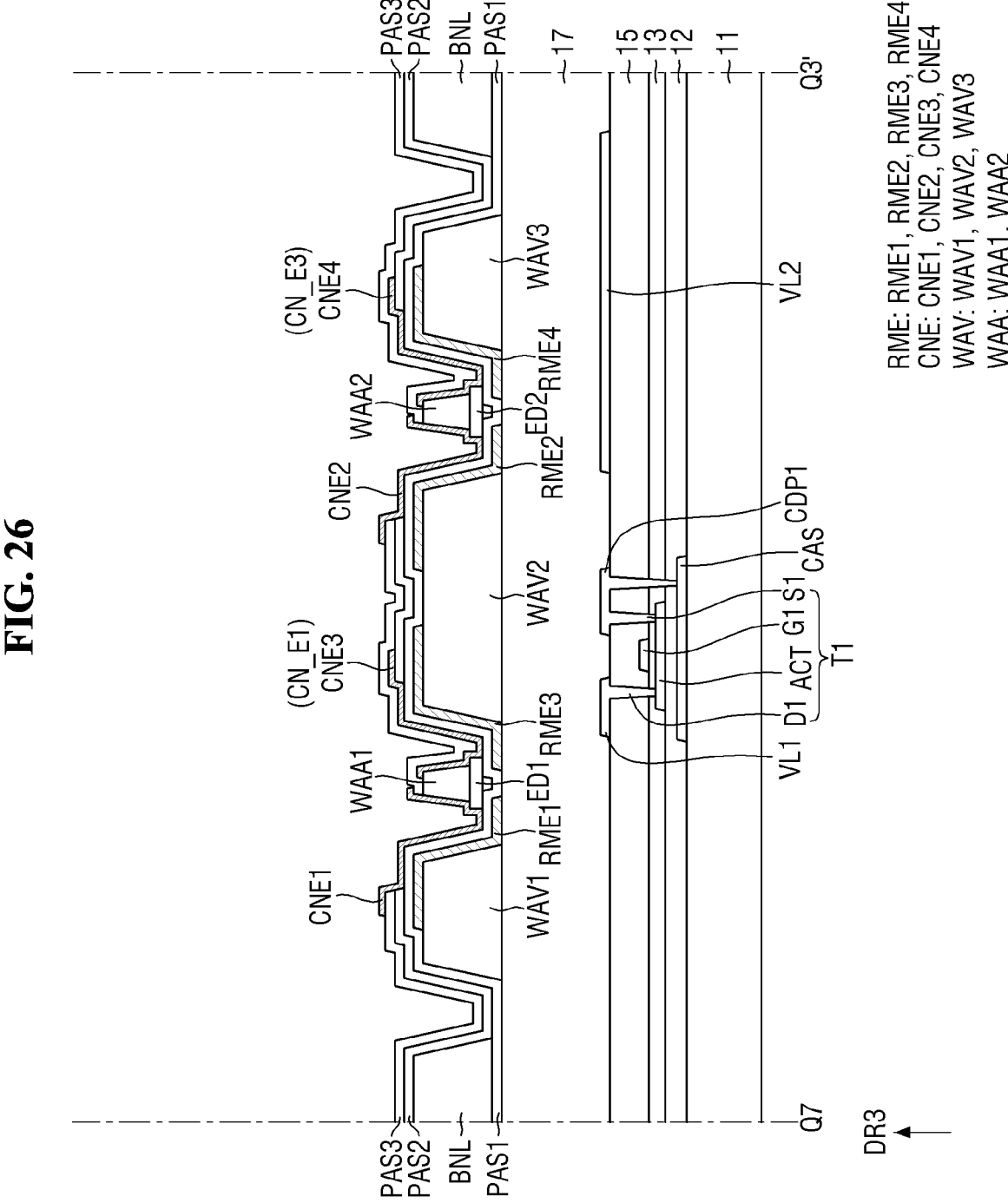
Figure 27:
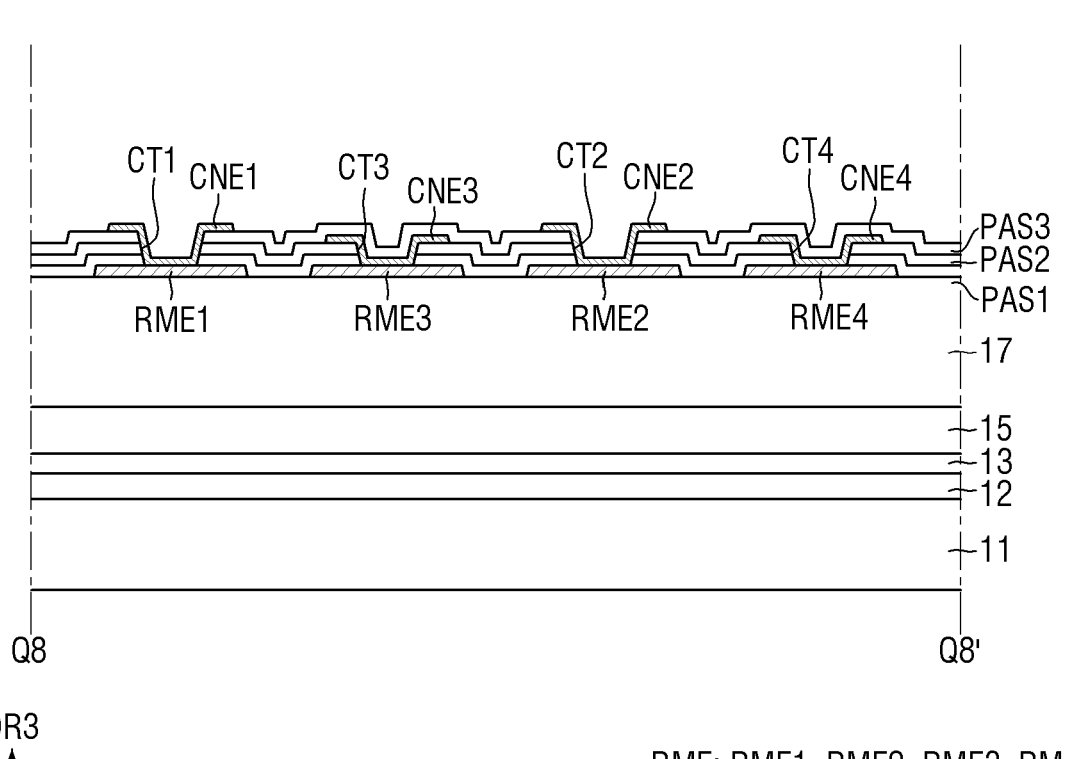
Figure 28:
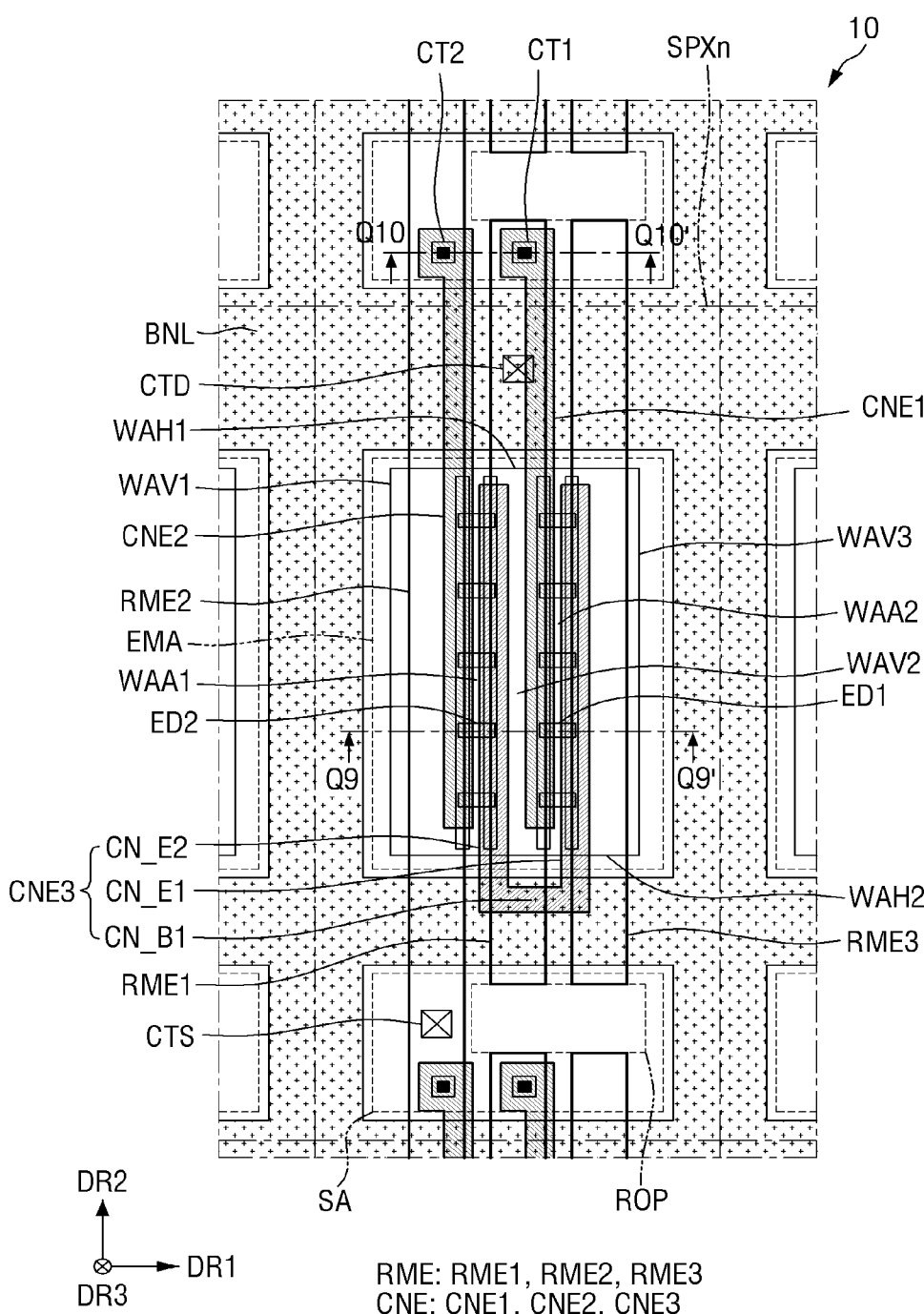
Figure 29:
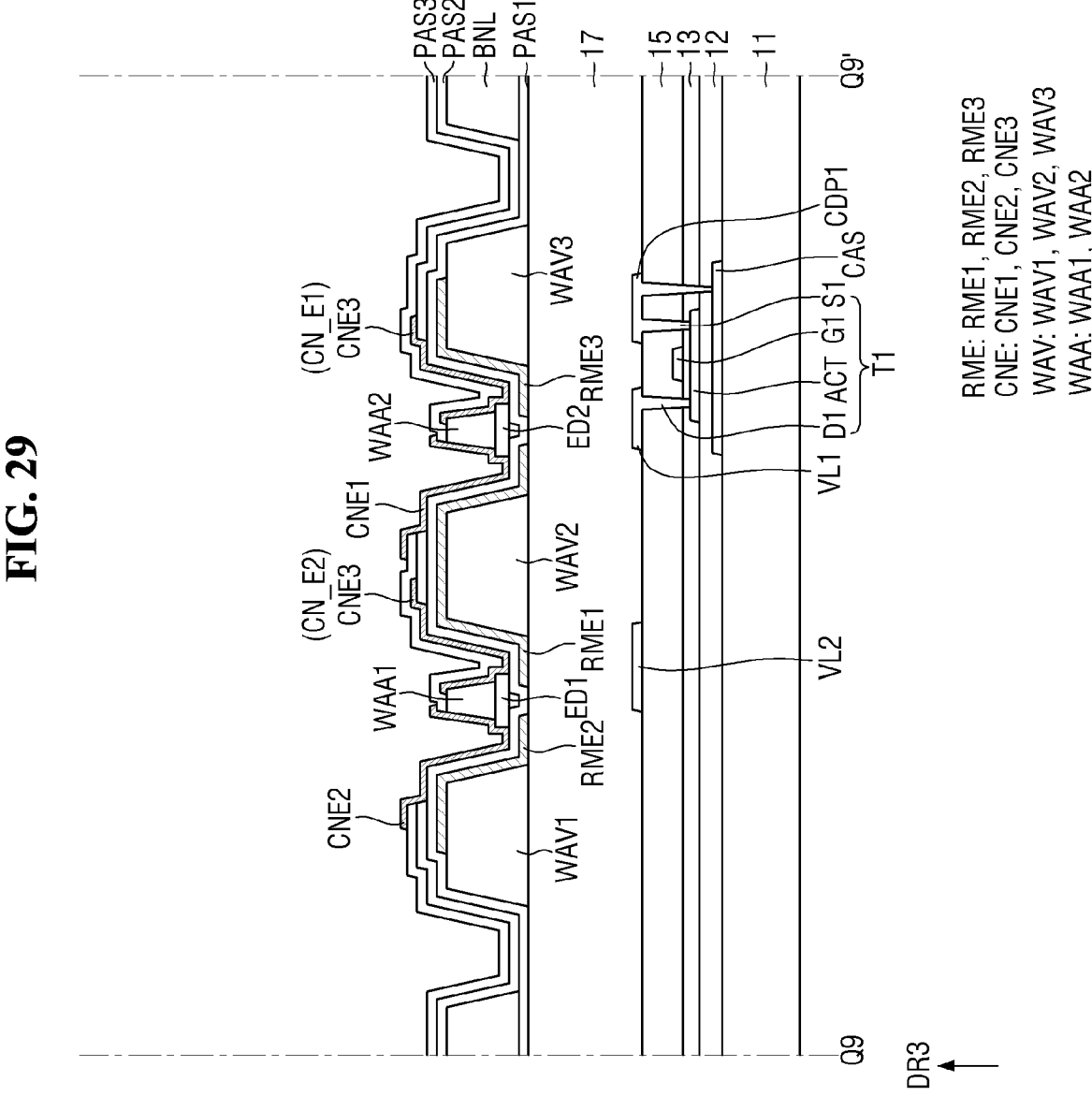
Figure 30:
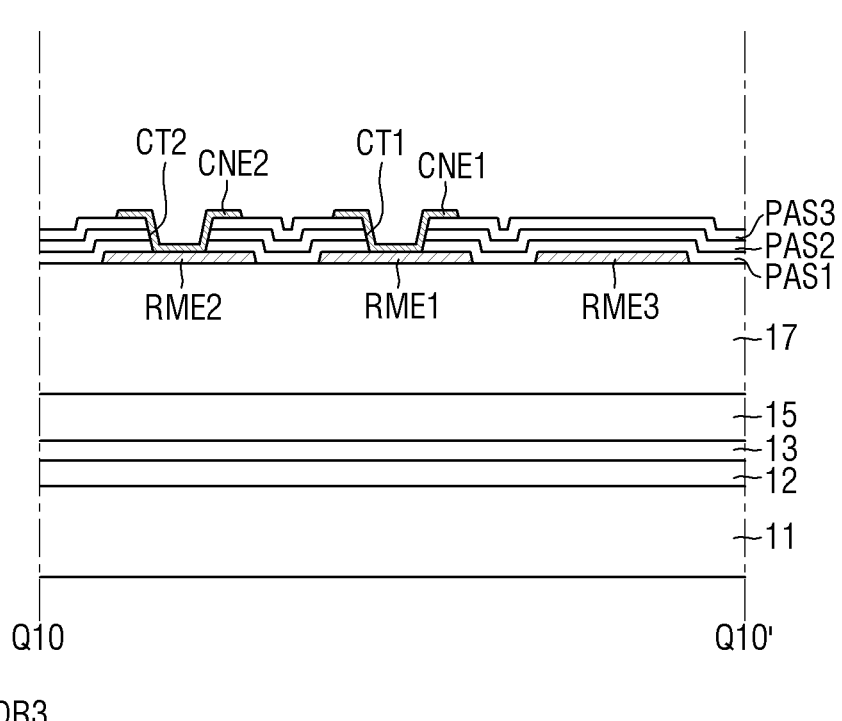

FIG. 10 is a schematic perspective view of a light-emitting element according to an embodiment of the disclosure;

FIGS. 11 to 17 are schematic cross-sectional views or plan views illustrating a method of fabricating a display device according to an embodiment of the disclosure;

FIG. 18 is a schematic plan view of a subpixel of a display device according to another embodiment of the disclosure;

FIG. 19 is a schematic cross-sectional view taken along line Q5-Q5' of FIG. 18;

FIG. 20 is a schematic cross-sectional view taken along line Q5-Q5' of FIG. 18;

FIG. 21 is a schematic plan view of a subpixel of a display device according to another embodiment of the disclosure;

FIG. 22 is a schematic cross-sectional view taken along line Q6-Q6' of FIG. 21;

FIG. 23 is a schematic plan view of a pixel of a display device according to another embodiment of the disclosure;

FIG. 24 is a schematic plan view of a pixel of a display device according to another embodiment of the disclosure;

FIG. 25 is a schematic plan view of a subpixel of a display device according to another embodiment of the disclosure;

FIG. 26 is a schematic cross-sectional view taken along line Q7-Q7' of FIG. 25;

FIG. 27 is a schematic cross-sectional view taken along line Q8-Q8' of FIG. 25;

FIG. 28 is a schematic plan view of a subpixel of a display device according to another embodiment of the disclosure;

FIG. 29 is a schematic cross-sectional view taken along line Q9-Q9' of FIG. 28; and FIG. 30 is a schematic cross-sectional view taken along line Q10-Q10' of FIG. 28.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments of the disclosure will hereinafter be described with reference to the accompanying drawings.

Figure 1:
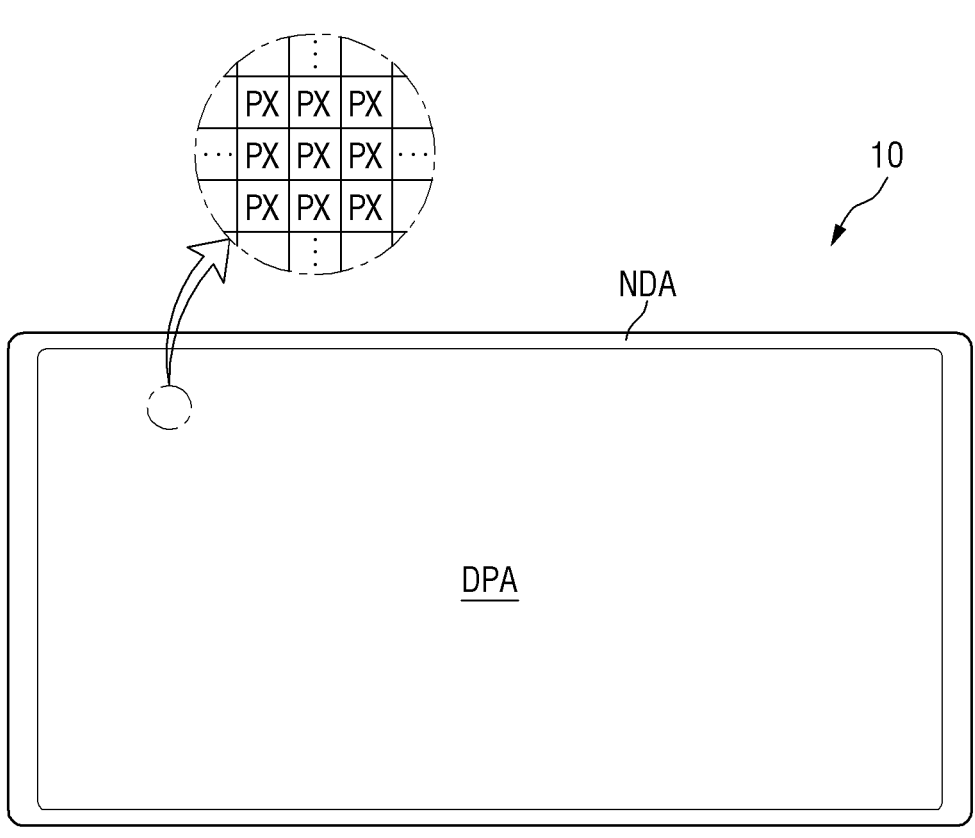
FIG. 1 is a schematic plan view of a display device according to an embodiment of the disclosure.

FIG. 1 is a schematic plan view of a display device according to an embodiment.

Referring to FIG. 1, a display device 10 displays a moving or still image. The display device 10 may refer to any types of electronic devices that provide a display screen. Examples of the display device 10 may include a television (TV), a laptop computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 includes a display panel that provides a display screen. Examples of the display panel include an inorganic light-emitting diode (ILED) display panel, an organic light-emitting diode (OLED) display panel, a quantum-dot light-emitting diode (QLED) display panel, a plasma display panel (PDP), and a field emission display (FED) panel. The display panel of the display device 10 will hereinafter be described as being an ILED display panel, but the disclosure is not limited thereto.

First, second, and third directions DR1, DR2, and DR3 are defined as illustrated in FIG. 1. The first and second directions DR1 and DR2 may be perpendicular to each other on the same plane. The third direction DR3 may be perpendicular to the plane defined by the first and second directions DR1 and DR2. The third direction DR3 may be perpendicular to each of the first and second directions DR1 and DR2. The third direction DR3 refers to the thickness direction of the display device 10.

The shape of the display device 10 may vary. For example, the display device 10 may have a rectangular shape that extends longer in the first direction DR1 than in the second direction DR2 in a plan view. As another example, the display device 10 may have a rectangular shape that extends longer in the second direction DR2 than in the first direction DR1 in a plan view. However, the disclosure is not limited to these examples. The display device may have various other shapes such as a square shape, a rectangular shape with rounded corners, another polygonal shape, or a circular shape. A display area DPA of the display device 10 may have a similar shape to the display device 10. FIG. 1 illustrates that the display device 10 and the display area DPA have a rectangular shape that extends longer in the first direction DR1 than in the second direction DR2.

The display device 10 may include the display area DPA and a non-display area NDA. The display area DPA is an area in which an image is displayed, and the non-display area NDA is an area in which an image is not displayed. The display area DPA may also be referred to as an active area, and the non-display area NDA may also be referred to as an inactive area. The display area DPA may generally account for a middle portion of the display device 10.

The display area DPA may include pixels PX. The pixels PX may be arranged in row and column directions. The pixels PX may have a rectangular or square shape in a plan view, but the disclosure is not limited thereto. As another example, the pixels PX may have a rhombic shape that is inclined with respect to a particular direction. The pixels PX may be alternately arranged in a stripe fashion or a PenTile® fashion. Each of the pixels PX may include one or more light-emitting elements that emit light of a particular wavelength range to emit light of a predetermined color.

The non-display area NDA may be disposed on the periphery of the display area DPA. The non-display area NDA may surround the entire display area DPA or portion of the display area DPA. The display area DPA may have a rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
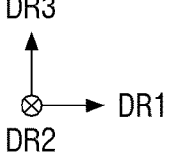
FIG. 2 is a schematic cross-sectional view of a pixel of the display device of FIG. 1.

FIG. 2 is a schematic cross-sectional view of a pixel of the display device of FIG. 1.

Referring to FIG. 2, the display area DPA of the display device 10 may include first, second, and third emission areas LA1, LA2, and LA3. The first, second, and third emission areas LA1, LA2, and LA3 may be areas that emit light generated by light-emitting elements ED of the display device 10 to the outside of the display device 10.

The display device 10 may include a substrate 11, a buffer layer 12, a transistor layer TFTL, a light-emitting element layer EML, a wavelength conversion layer WLCL, a color filter layer CFL, and an encapsulation layer TFE.

The substrate 11 may be a base substrate or a base member and may be formed of an insulating material such as a polymer resin. For example, the substrate 11 may be a flexible substrate that is bendable, foldable, or rollable. The substrate 11 may include polyimide (PI), but the disclosure is not limited thereto.

The buffer layer 12 may be disposed on the substrate 11. The buffer layer 12 may be formed of an inorganic film capable of preventing the penetration of air or moisture. For example, the buffer layer 12 may include inorganic films that are alternately stacked.

The transistor layer TFTL may be disposed on the buffer layer 12. The transistor layer TFTL may include first transistors T1, a gate insulating layer 13, a first interlayer insulating layer 15, a second interlayer insulating layer 17, and a via layer 19.

The first transistors T1 may be disposed on the buffer layer BF and may form pixel circuits of pixels PXL. For example, the first transistors T1 may be driving or switching transistors of pixel circuits. The first transistors T1 may include active layers ACT, gate electrodes G1, source electrodes SE, and drain electrodes DE. Each of the active layers ACT may include conductor areas ACTa and ACTb and a channel area ACTc between the conductor areas ACTa and ACTb.

The light-emitting element layer EML may be disposed on the transistor layer TFTL. The light-emitting element layer EML may include a partition WA, light-emitting elements ED, and a bank BNL. The light-emitting elements ED may be disposed on the first transistors T1. The light-emitting elements ED may be disposed between first electrodes and second electrodes and may be electrically connected to first connecting electrodes and second connecting electrodes.

The transistor layer TFTL and the light-emitting element layer EML will be described below with reference to FIGS. 5 to 7.

A planarization layer 41 may be disposed on the light-emitting element layer EML to planarize the top of the light-emitting element layer EML. The planarization layer 41 may include an organic material. For example, the planarization layer 41 may include at least one of an acrylic resin, an epoxy resin, a phenolic resin, a polyamide resin, and a PI resin, but the disclosure is not limited thereto. The planarization layer 41 may not be provided.

The wavelength conversion layer WLCL may include a first capping layer CAP1, a first light-blocking member BK1, a first wavelength converter WLC1, a second wavelength converter WLC2, a light transmitter LTU, a second capping layer CAP2, and a planarization layer 43.

The first capping layer CAP1 may be disposed on the planarization layer 41 of the light-emitting element layer EML. The first capping layer CAP1 may seal the bottom surfaces of the first and second wavelength converters WLC1 and WLC2 and the light transmitter LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, but the disclosure is not limited thereto. The first capping layer CAP1 may not be provided.

The first light-blocking member BK1 may be disposed in first, second, and third light-blocking areas BA1, BA2, and BA3 on the first capping layer CAP1. The first light-blocking member BK1 may overlap the bank BNL in a thickness direction. The first light-blocking member BK may block the transmission of light. The first light-blocking member BK1 may prevent color mixing due to the infiltration of light between the first, second, and third emission areas LA1, LA2, and LA3, thereby improving color reproducibility. The first light-blocking member BK1 may be arranged in a lattice shape to surround the first, second, and third emission areas LA1, LA2, and LA3 in a plan view.

The first light-blocking member BK1 may include an organic light blocking material and a liquid repellent. The liquid repellent may be formed of a fluorine-containing monomer or a fluorine-containing polymer, particularly, fluorine-containing aliphatic polycarbonate. For example, the first light blocking member BK1 may be formed of a black organic material including a liquid repellent. The first light blocking member BK1 may be formed via the coating and exposure of an organic light blocking material including a liquid repellent.

As the first light-blocking member BK1 includes the liquid repellent, the first light-blocking member BK1 can separate the first and second wavelength converters WLC1 and WLC2 and the light transmitter LTU to correspond to their respective emission areas LA. For example, in case that the first and second wavelength converters WLC1 and WLC2 and the light transmitter LTU are formed by inkjet printing, an ink composition may flow along the top surface of the first light-blocking member BK1. In this case, the first light-blocking member BK1 may include the liquid repellent to induce the ink composition to flow into each of the first, second, and third emission areas LA1, LA2, and LA3. As a result, the first light-blocking member BK1 can prevent the mixing of the ink composition.

The first wavelength converter WLC1 may be disposed in the first emission area LA1, on the first capping layer CAP1. The first wavelength converter WLC1 may be surrounded by the first light-blocking member BK1. The first wavelength converter WLC1 may include a first base resin BS1, a first scatterer SCT1, and a first wavelength shifter WLS1.

The first base resin BS1 may include a material having a high light transmittance. The first base resin BS1 may be formed of a transparent organic material. For example, the first base resin BS1 may include at least one of the following organic materials: an epoxy resin, an acrylic resin, a cardo resin, and an imide resin.

The first scatterer SCT1 may have a different refractive index from the first base resin BS1 and may form an optical interface with the first base resin BS1. For example, the first scatterer SCT1 may include a light-scattering material or light-scattering particles capable of scattering at least some light. For example, the first scatterer SCT1 may include particles of a metal oxide such as titanium oxide ($TiO_2$), zirconium oxide ($ZrO_2$), aluminum oxide ($Al_xO_y$), indium oxide ($In_2O_3$), zinc oxide (ZnO), or tin oxide ($SnO_2$) or may include particles of an organic material such as an acrylic resin or a urethane resin. The first scatterer SCT1 may scatter incident light in random directions regardless of the incident angle of the incident light, substantially without changing the peak wavelength of the incident light.

The first wavelength shifter WLS1 may convert or shift the peak wavelength of the incident light into a first peak wavelength. For example, the first wavelength shifter WLS1 may convert blue light provided thereto into red light having a single peak wavelength of about 610 nm to about 650 nm and may emit the red light. The first wavelength shifter WLS1 may include quantum dots, quantum rods, or a phosphor. The quantum dots may be a particulate material that emits light of a particular color in response to the electrons transitioning from the conduction band to the valance band.

The quantum dots may be a semiconductor nanocrystal material. As the quantum dots have a predetermined band gap depending on their composition and size, the quantum dots may absorb light and emit light of a predetermined wavelength. The semiconductor nanocrystal material include a group IV element (e.g., nano-element), a group II-VI compound (e.g., nano-compound), a group III-V compound (e.g., nano-compound), a group IV-VI compound (e.g., nano-compound), and a combination thereof.

For example, the quantum dots may have a core-shell structure consisting of a core including the above-described semiconductor nanocrystal material and a shell surrounding the core. The shells of the quantum dots may serve as protective layers for maintaining the semiconductor characteristics of the quantum dots by preventing chemical denaturation of the cores of the quantum dots and/or as charging layers for imparting electrophoretic characteristics to the quantum dots. The shells of the quantum dots may have a single-layer structure or a multi-layer structure. The interfaces between the cores and the shells of the quantum dots may have a concentration gradient in which the concentration of the element(s) at the shells of the quantum dots gradually decreases toward the centers of the shells of the quantum dots. The shells of the quantum dots may include an oxide of a metal or a non-metal, a semiconductor compound, or a combination thereof.

Light emitted by the first wavelength shifter WLS1 may have a full width at half maximum (FWHM) of about 45 nm or less, about 40 nm or less, or about 30 nm or less, and the color purity and color reproducibility of the display device 10 can be further improved. Light emitted by the first wavelength shifter WLS1 may be released in various directions regardless of the incident angle of the incident light. Thus, the side visibility of a red color displayed in the first emission area LA1 can be improved.

Some of blue light provided from the light-emitting element layer EML may not be converted into red light by the first wavelength shifter WLS1 but may transmit through the first wavelength converter WLC1. Some of the blue light provided from the light-emitting element layer EML may be incident upon a first color filter CF1 without being converted by the first wavelength converter WLC1 and may be blocked by the first color filter CF1. The red light obtained by the first wavelength converter WLC1 may be emitted to the outside through the first color filter CF1. Thus, the first emission area LA1 may emit red light.

The second wavelength converter WLC2 may be disposed in the second emission area LA2, on the first capping layer CAP1. The second wavelength converter WLC2 may be surrounded by the first light-blocking member BK1. The second wavelength converter WLC2 may include a second base resin BS2, a second scatterer SCT2, and a second wavelength shifter WLS2.

The second base resin BS2 may include a material having a high light transmittance. The second base resin BS2 may be formed of a transparent organic material. For example, the second base resin BS2 and the first base resin BS1 may be formed of the same material, or the second base resin BS2 may include any of the above-mentioned materials for forming the first base resin BS1.

The second scatterer SCT2 and the second base resin BS2 may have different refractive indexes and may form an optical interface. For example, the second scatterer SCT2 may include a light-scattering material or light-scattering particles capable of scattering at least some light. For example, the second scatterer SCT2 and the first scatterer SCT1 may be formed of the same material, or the second scatterer SCT2 may include any of the above-mentioned materials for forming the first scatterer SCT1. The second scatterer SCT2 may scatter the incident light in random directions regardless of the incident angle of the incident light, substantially without changing the peak wavelength of the incident light.

The second wavelength shifter WLS2 may convert or shift the peak wavelength of the incident light into a second peak wavelength which is different from the first peak wavelength. For example, the second wavelength shifter WLS2 may convert blue light provided thereto into green light having a single peak wavelength of about 510 nm to about 550 nm and may emit the green light. The second wavelength shifter WLS2 may include quantum dots, quantum rods, or a phosphor. The second wavelength shifter WLS2 and the first wavelength shifter WLS1 may include the same material. The second wavelength shifter WLS2 may be formed of quantum dots, quantum rods, or a phosphor such that the wavelength range of the second wavelength shifter WLS2 may differ from the wavelength range of the first wavelength shifter WLS1.

The light transmitter LTU may be disposed in the third emission area LA3, on the first capping layer CAP1. The light transmitter LTU may be surrounded by the first light-blocking member BK1. The light transmitter LTU may transmit the incident light therethrough while maintaining the peak wavelength of the incident light. The light transmitter LTU may include a third base resin BS3 and a third scatterer SCT3.

The third base resin BS3 may include a material having a high light transmittance. The third base resin BS3 may be formed of a transparent organic material. For example, the third base resin BS3 and the first or second base resin BS1 or BS2 may be formed of the same material, or the third base resin BS3 may include any of the above-mentioned materials for forming the first or second base resin BS1 or BS2.

The third scatterer SCT3 and the third base resin BS3 may have different refractive indices and may form an optical interface. For example, the third scatterer SCT3 may include a light-scattering material or light-scattering particles capable of scattering at least some light. For example, the third scatterer SCT3 and the first or second scatterer SCT1 or SCT2 may be formed of the same material, or the third scatterer SCT3 may include any of the above-mentioned materials for forming the first or second scatterer SCT1 or SCT2. The third scatterer SCT3 may scatter the incident light in random directions regardless of the incident angle of the incident light, substantially without changing the peak wavelength of the incident light.

As the wavelength conversion layer WLCL is disposed directly on the planarization layer 41 of the light-emitting element layer EML, the display device 10 may not need a separate substrate for the first and second wavelength converters WLC1 and WLC2 and the light transmitter LTU. Thus, the first and second wavelength converters WLC1 and WLC2 and the light transmitter LTU can be easily aligned with the first, second, and third emission areas LA1, LA2, and LA3, respectively, and the thickness of the display device 10 can be reduced.

The second capping layer CAP2 may cover the first and second wavelength converters WLC1 and WLC2, the light transmitter LTU, and the first light-blocking member BK1. For example, the second capping layer CAP2 may seal the first and second wavelength converters WLC1 and WLC2, the light transmitter LTU, and the first light-blocking member BK1 and may thereby prevent the first and second wavelength converters WLC1 and WLC2, the light transmitter LTU, and the first light-blocking member BK1 from being damaged or contaminated. The second capping layer CAP2 and the first capping layer CAP1 may be formed of the same material, or the second capping layer CAP2 may include any of the above-described materials for forming the first capping layer CAP1.

The planarization layer 43 may be disposed on the second capping layer CAP2 and may planarize the tops of the first and second wavelength converters WLC1 and WLC2 and the light transmitter LTU. The planarization layer 43 may include an organic material. For example, the planarization layer 43 may include at least one of an acrylic resin, an epoxy resin, a phenolic resin, a polyamide resin, and a PI resin.

The color filter layer CFL may include a second light-blocking member BK2, first, second, and third color filters CF1, CF2, and CF3, and a passivation layer PRT.

The second light-blocking member BK2 may be disposed in the first, second, and third light-blocking areas BA1, BA2, and BA3, on the planarization layer 43 of the wavelength conversion layer WLCL. The second light-blocking member BK2 may overlap the first light-blocking member BK1 or the bank BNL in the thickness direction. The second light-blocking member BK2 may block the transmission of light. The second light-blocking member BK2 may prevent color mixing due to the infiltration of light between the first, second, and third emission areas LA1, LA2, and LA3 and may thus improve color reproducibility. The second light-blocking member BK2 may be arranged in a lattice shape to surround the first, second, and third emission areas LA1, LA2, and LA3 in a plan view.

The first color filter CF1 may be disposed in the first emission area LA1, on the planarization layer 43. The first color filter CF1 may be surrounded by the second light-blocking member BK2. The first color filter CF1 may overlap the first wavelength converter WLC1 in the thickness direction. The first color filter CF1 may selectively transmit light of a first color (e.g., red light) therethrough and may block or absorb light of a second color (e.g., green light) and light of a third color (e.g., blue light). For example, the first color filter CF1 may be a red color filter and may include a red colorant. The red colorant may be a red dye or a red pigment.

The second color filter CF2 may be disposed in the second emission area LA2, on the planarization layer 43. The second color filter CF2 may be surrounded by the second light-blocking member BK2. The second color filter CF2 may overlap the second wavelength converter WLC2 in the thickness direction. The second color filter CF2 may selectively transmit light of the second color (e.g., green light) therethrough and may block or absorb light of the first color (e.g., red light) and light of the third color (e.g., blue light). For example, the second color filter CF2 may be a green color filter and may include a green colorant. The green colorant may be a green dye or a green pigment.

The third color filter CF3 may be disposed in the third emission area LA3, on the planarization layer 43. The third color filter CF3 may be surrounded by the second light-blocking member BK2. The third color filter CF3 may overlap the light transmitter LTU in the thickness direction. The third color filter CF3 may selectively transmit light of the third color (e.g., blue light) therethrough and may block or absorb light of the first color (e.g., red light) and light of the second color (e.g., green light). For example, the third color filter CF3 may be a blue color filter and may include a blue colorant. The blue colorant may be a blue dye or a blue pigment.

The first, second, and third color filters CF1, CF2, and CF3 may reduce the reflection of external light by absorbing some of the external light. Thus, the first, second, and third color filters CF1, CF2, and CF3 can prevent color distortion that may be caused by the reflection of external light.

As the first, second, and third color filters CF1, CF2, and CF3 are disposed directly on the planarization layer 43 of the wavelength conversion layer WLCL, the display device 10 may not need a separate substrate for the first, second, and third color filters CF1, CF2, and CF3. Thus, the thickness of the display device 10 can be reduced.

The passivation layer PRT may cover the first, second, and third color filters CF1, CF2, and CF3. The passivation layer PRT may protect the first, second, and third color filters CF1, CF2, and CF3.

The encapsulation layer TFE may be disposed on the passivation layer PRT of the color filter layer CFL. The encapsulation layer TFE may cover the top surface and the side surfaces of a display layer. For example, the encapsulation layer may include at least one inorganic film and may thereby prevent the penetration of oxygen or moisture. The encapsulation layer TFE may also include at least one organic film and may thereby protect the display device 10 from a foreign material such as dust. For example, the encapsulation layer TFE may have a structure in which at least one organic film is stacked between two inorganic films. The two inorganic films may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or lithium fluoride. The organic film may include an acrylic resin, a methacrylic resin, polyisoprene, a vinyl resin, an epoxy resin, a urethane resin, a cellulose resin, or a perylene resin. However, the structure of the encapsulation layer TFE is not particularly limited, but may vary.

The transistor layer TFTL and the light-emitting element layer EML will hereinafter be described, taking the planar and cross-sectional structures of a pixel of the display device 10.

Figure 3:
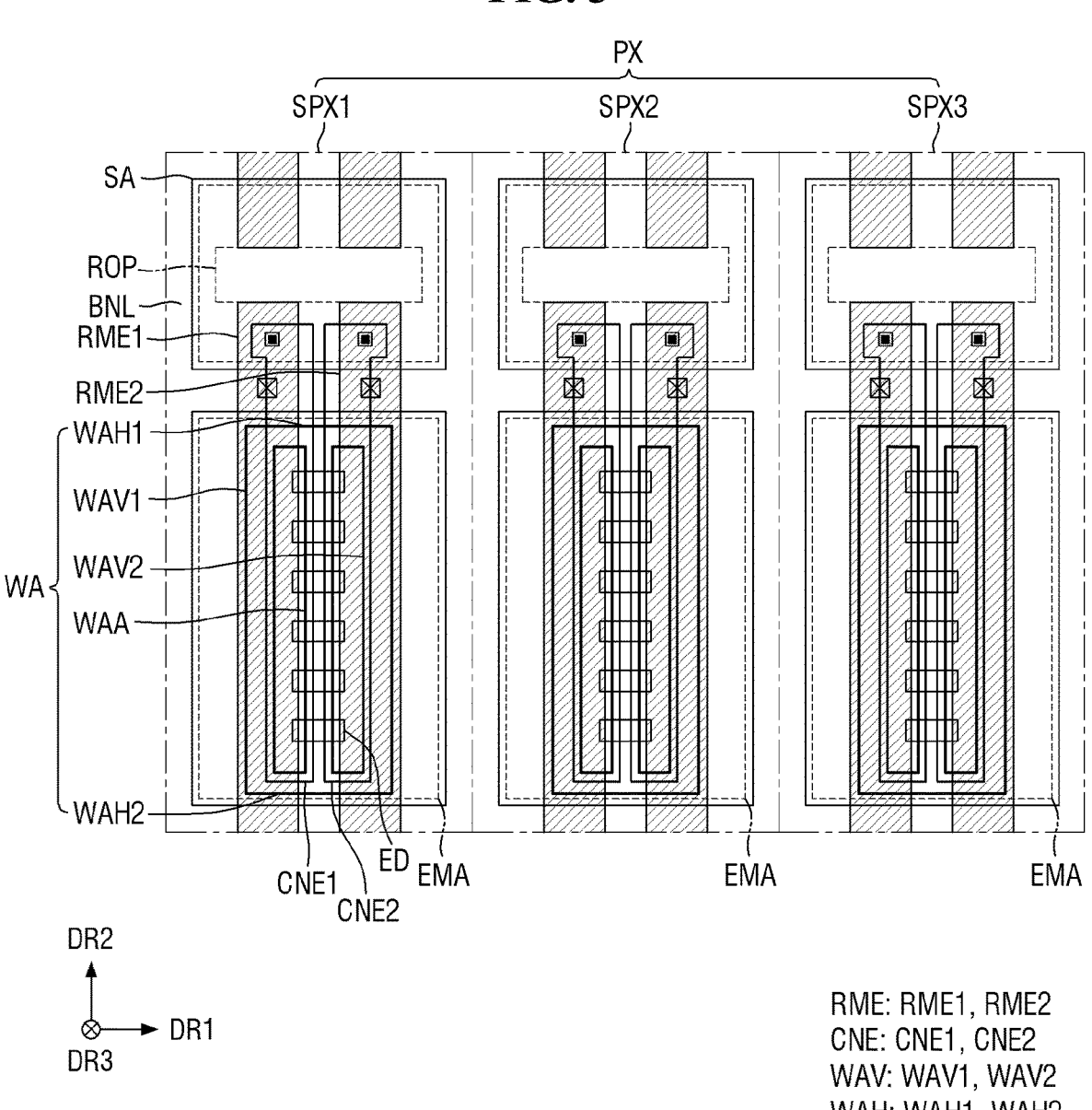
FIG. 3 is a schematic plan view of a pixel of the display device of FIG. 1.

FIG. 3 is a schematic plan view of a pixel of the display device of FIG. 1. FIG. 3 illustrates a pixel PX and a portion of another pixel PX adjacent to the pixel PX in the second direction DR2.

Referring to FIG. 3, a pixel PX of the display device 10 may include subpixels SPXn (where n is 1 to 3). For example, the pixel PX may include first, second, and third subpixels SPX1, SPX2, and SPX3. The first subpixel SPX1 may emit first-color light, the second subpixel SPX2 may emit second-color light, and the third subpixel SPX3 may emit third-color light. For example, the first-color light, the second-color light, and the third-color light may be blue light, green light, and red light, respectively, but the disclosure is not limited thereto. As another example, the subpixels SPXn may emit light of the same color, for example, blue light. FIG. 3 illustrates that the pixel PX includes three subpixels SPXn, but the pixel PX may include more than three subpixels SPXn.

Each of the subpixels SPXn may include an emission area EMA and a non-emission area. The emission area EMA may be a region where light-emitting elements ED are disposed to emit light of a particular wavelength range, and the non-emission area may be an area that is not reached by light emitted by the light-emitting elements ED and thus does not output light because of the light-emitting elements ED not being disposed therein. The emission area EMA may include the region where the light-emitting elements ED are disposed and a region that outputs light emitted by the light-emitting elements ED, around the light-emitting elements ED.

However, the disclosure is not limited thereto. The emission area EMA may include a region that outputs light emitted by the light-emitting elements ED and then reflected or refracted by other members. Light-emitting elements ED may be included in each of the subpixels SPXn, and a region where the light-emitting elements ED are disposed and a region around the region where the light-emitting elements ED are disposed may form the emission area EMA of each of the subpixels SPXn.

FIG. 3 illustrates that emission areas EMA of the subpixels SPXn have substantially the same size, but the disclosure is not limited thereto. In some embodiments, the emission areas EMA of the subpixels SPXn may have different sizes depending on the colors or wavelength ranges of light emitted by the light-emitting elements ED disposed therein.

Each of the subpixels SPXn may further include a subarea SA, which is disposed in the non-emission area. In each of the subpixels SPXn, the subarea SA may be disposed on a side, in the second direction DR2, of the emission area EMA and may be disposed between a pair of adjacent emission areas EMA in the second direction DR2. For example, emission areas EMA or subareas SA may be repeatedly arranged in the second direction DR2 and may be alternately arranged in the second direction DR2. However, the disclosure is not limited thereto. The emission areas EMA and the subareas SA of the pixel PX may have a different layout from that illustrated in FIG. 3. An emission area EMA and a subarea SA on a side, in the second direction DR2, of the emission area EMA (e.g., on an upper side of the emission area EMA) may be included in each of the subpixels SPXn of the pixel PX of FIG. 3, and a subarea SA of another subpixel SPXn adjacent to the corresponding subpixel SPXn in the second direction DR2 may be disposed on the other side, in the second direction DR2, of the emission area EMA (e.g., on a lower side of the emission area EMA).

The bank BNL may be disposed between the subareas SA and the emission areas EMA of the subpixels SPXn of the pixel PX, and the distance between the subareas SA and the emission areas EMA may vary depending on the width of the bank BNL. The subareas SA do not emit light because of light-emitting elements ED not being disposed therein, but some of electrodes RME may be disposed in the subareas SA. Sets of electrodes RME disposed in different subpixels SPXn may be separated from one another in separation parts ROP of the subareas SA.

The bank BNL may include parts that extend in the first direction DR1 and parts that extend in the second direction DR2 and may be arranged in a lattice pattern in a plan view, over the entire display area DPA. The bank BNL may be disposed along the boundaries of each of the subpixels SPXn to separate the adjacent subpixels SPXn from one another. The bank BNL may be disposed to surround the emission areas EMA of the subpixels SPXn to separate the emission areas EMA from one another.

The pixel PX or each of the subpixels SPXn may include a pixel driving circuit. Lines may pass through or pass by the pixel PX or each of the subpixels SPXn and apply driving signals to the pixel driving circuit. The pixel driving circuit may include transistors and capacitors. The numbers of transistors and capacitors included in each pixel driving circuit may vary. For example, the pixel driving circuit may have a "3T1C" structure including three transistors and a capacitor. The pixel driving circuit will hereinafter be described as having the "3T1C" structure, but the disclosure is not limited thereto. As another example, various other structures such as a "2T1C," "7T1C," or "6T1C" structure may be applicable to the pixel driving circuit.

Figure 4:
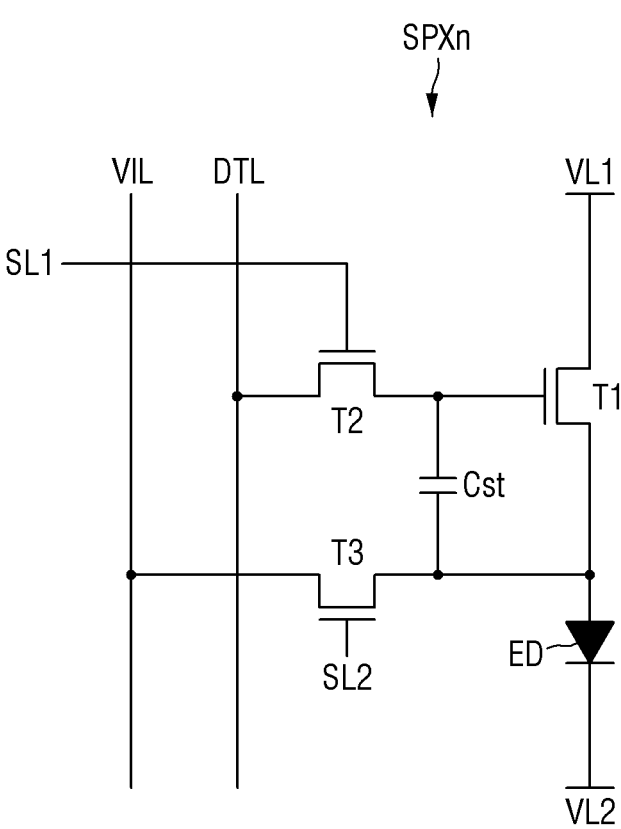
FIG. 4 is an equivalent circuit diagram of a subpixel of the display device of FIG. 1.

FIG. 4 is an equivalent circuit diagram of a subpixel of the display device of FIG. 1.

Referring to FIG. 4, a subpixel SPXn includes a light-emitting element ED, three transistors, for example, first, second, and third transistors T1, T2, and T3, and one storage capacitor Cst.

The light-emitting element ED may emit light in accordance with a current applied thereto via the first transistor T1. The light-emitting element ED may emit light of a particular wavelength range in accordance with electrical signals transmitted thereto from first and second electrodes, which are electrically connected to both ends of the light-emitting element ED.

A first end of the light-emitting element ED may be electrically connected to a source electrode of the first transistor T1, and a second end of the light-emitting element ED may be electrically connected to a second voltage line VL2 to which a low-potential voltage (hereinafter, a second power supply voltage) lower than a high-potential voltage (hereinafter, a first power supply voltage) is supplied.

The first transistor T1 controls a current flowing from a first voltage line VL1, to which the first power supply voltage is supplied, to the light-emitting element ED in accordance with the difference in voltage between the gate electrode and the source electrode of the first transistor T1. For example, the first transistor T1 may be a transistor for driving the light-emitting element ED. The gate electrode of the first transistor T1 may be electrically connected to a source electrode of the second transistor T2, the source electrode of the first transistor T1 may be electrically connected to the first end of the light-emitting element ED, and a drain electrode of the first transistor T1 may be electrically connected to the first voltage line VL1, to which the first power supply voltage is supplied.

The second transistor T2 is turned on by a scan signal from a first scan line SL1 to electrically connect a data line DTL to the gate electrode of the first transistor T1. The gate electrode of the second transistor T2 may be electrically connected to the first scan line SL1, the source electrode of the second transistor T2 may be electrically connected to the gate electrode of the first transistor T1, and a drain electrode of the second transistor T2 may be electrically connected to the data line DTL.

The third transistor T3 is turned on by a scan signal from a second scan line SL2 to electrically connect an initialization voltage line VIL to the first end of the light-emitting element ED. A gate electrode of the third transistor T3 may be electrically connected to the second scan line SL2, a drain electrode of the third transistor T3 may be electrically connected to the initialization voltage line VIL, and a source electrode of the third transistor T3 may be electrically connected to the first end of the light-emitting element ED or the source electrode of the first transistor T1. FIG. 4 illustrates that the first and second scan lines SL1 and SL2 are separate, but the disclosure is not limited thereto. In some embodiments, the first and second scan lines SL1 and SL2 may be provided as a single line, in which case, the second and third transistors T2 and T3 may be turned on by the same scan signal.

The source electrodes and the drain electrodes of the first, second, and third transistors T1, T2, and T3 are not limited to the above descriptions, and may be in a reversed configuration. The first, second, and third transistors T1, T2, and T3 may be formed as thin-film transistors (TFTs). FIG. 4 illustrates that the first, second, and third transistors T1, T2, and T3 are formed as N-type metal-oxide semiconductor field-effect transistors (MOSFETs), but the disclosure is not limited thereto. As another example, the first, second, and third transistors T1, T2, and T3 may be formed as P-type MOSFETs. As another example, some of the first, second, and third transistors T1, T2, and T3 may be formed as N-type MOSFETS, and other transistor(s) may be formed as P-type MOSFETs.

The storage capacitor Cst is formed between the gate electrode and the source electrode of the first transistor T1. The storage capacitor Cst stores a differential voltage corresponding to the difference in voltage between the gate electrode and the source electrode of the first transistor T1.

The structure of a pixel PX of the display device 10 will hereinafter be described in further detail.

Figure 5:
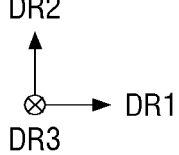
FIG. 5 is a schematic plan view of a first subpixel of FIG. 3.
Figure 8:
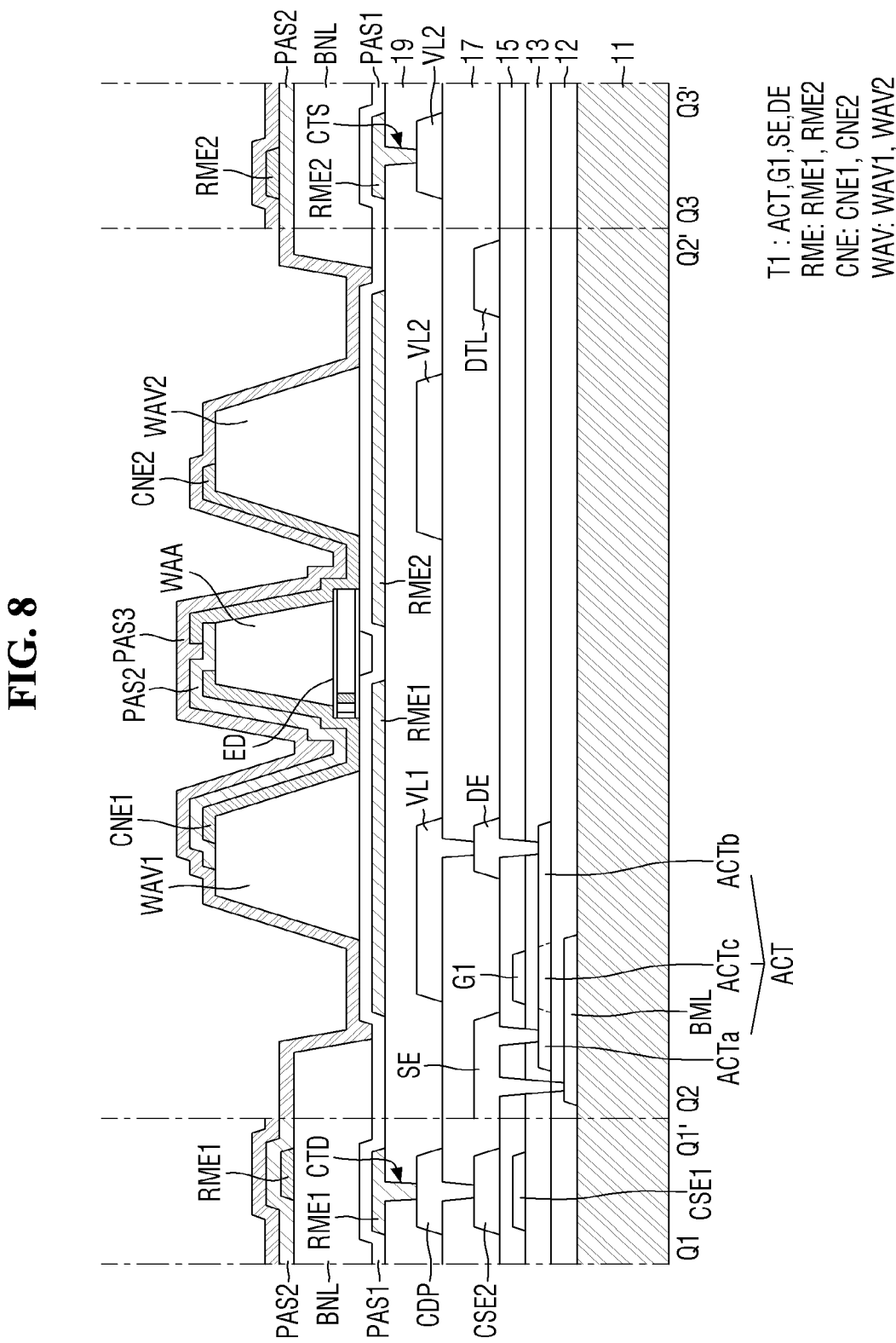
FIG. 8 is a schematic cross-sectional view taken along lines Q1-Q1', Q2-Q2', and Q3-Q3' of FIG. 5.
Figure 9:
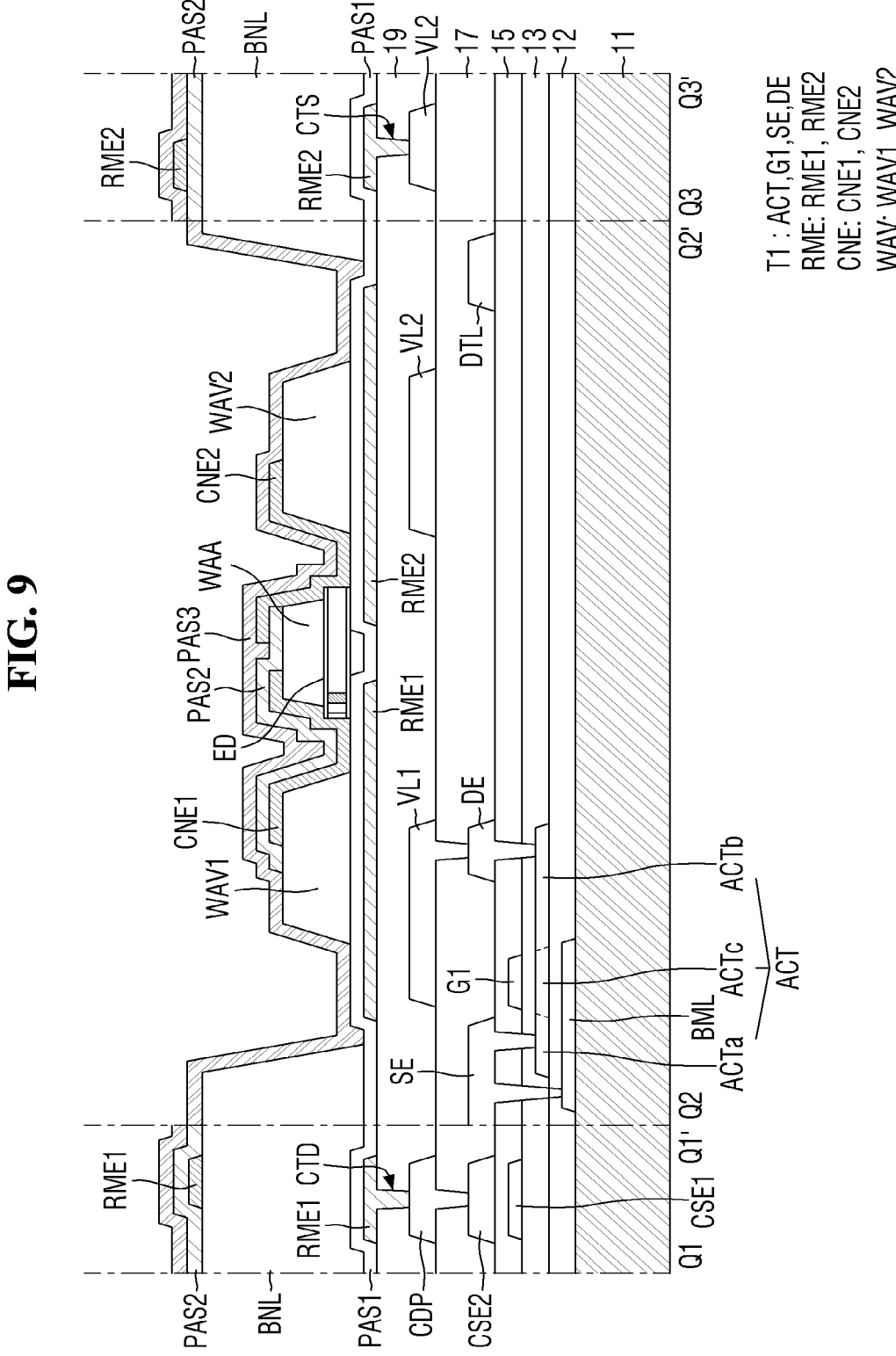
FIG. 9 is a schematic cross-sectional view taken along lines Q1-Q1', Q2-Q2', and Q3-Q3' of FIG. 5.

FIG. 5 is a schematic plan view of the first subpixel of FIG. 3. FIG. 6 is a schematic cross-sectional view taken along lines Q1-Q1', Q2-Q2', and Q3-Q3' of FIG. 5. FIG. 7 is a schematic cross-sectional view taken along line Q4-Q4' of FIG. 5. FIG. 8 is a schematic cross-sectional view taken along lines Q1-Q1', Q2-Q2', and Q3-Q3' of FIG. 5. FIG. 9 is a schematic cross-sectional view taken along lines Q1-Q1', Q2-Q2', and Q3-Q3' of FIG. 5. Descriptions of elements or features that have already been described above with reference to FIG. 2 will be simplified.

Figure 6:
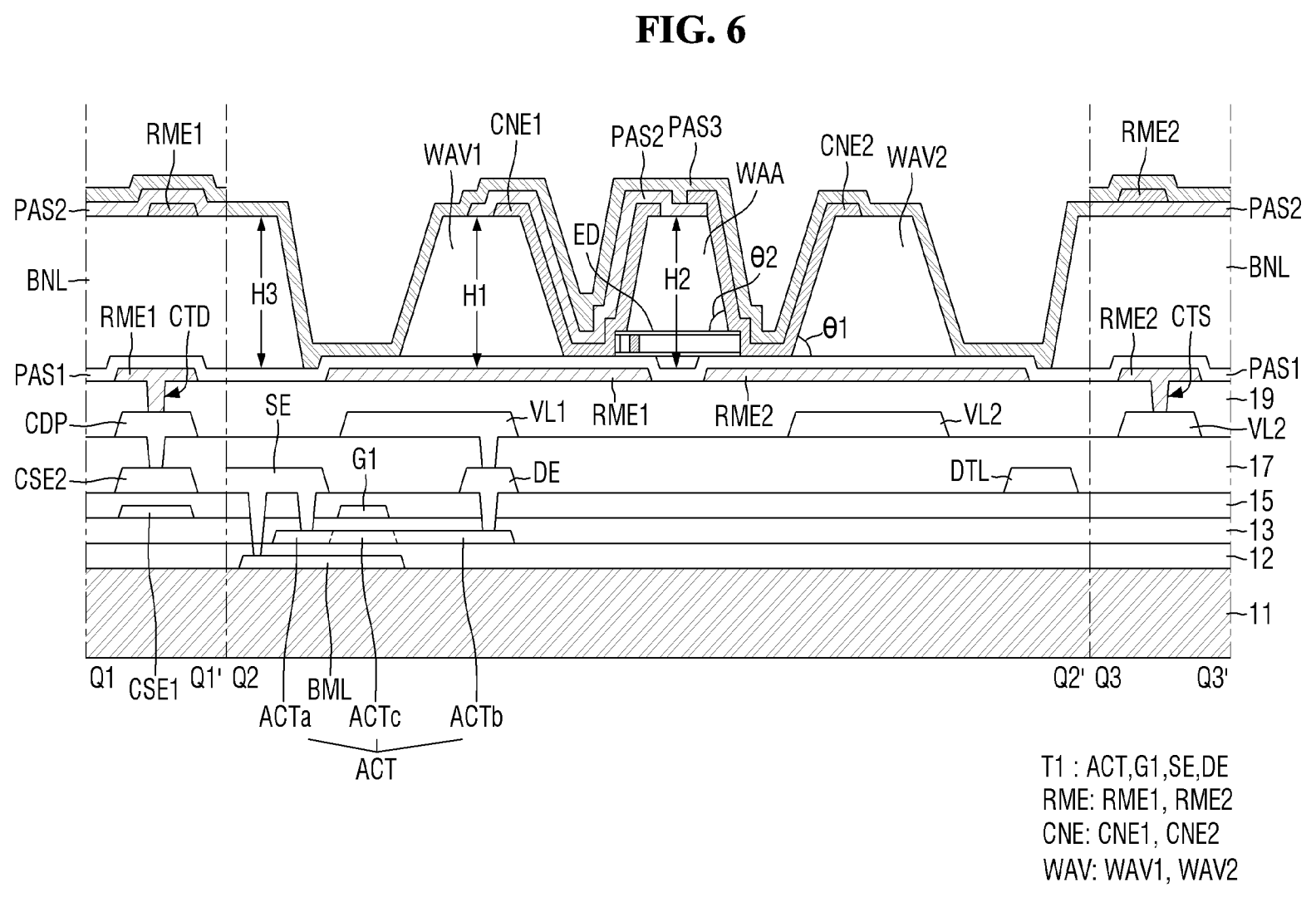
Figure 7:
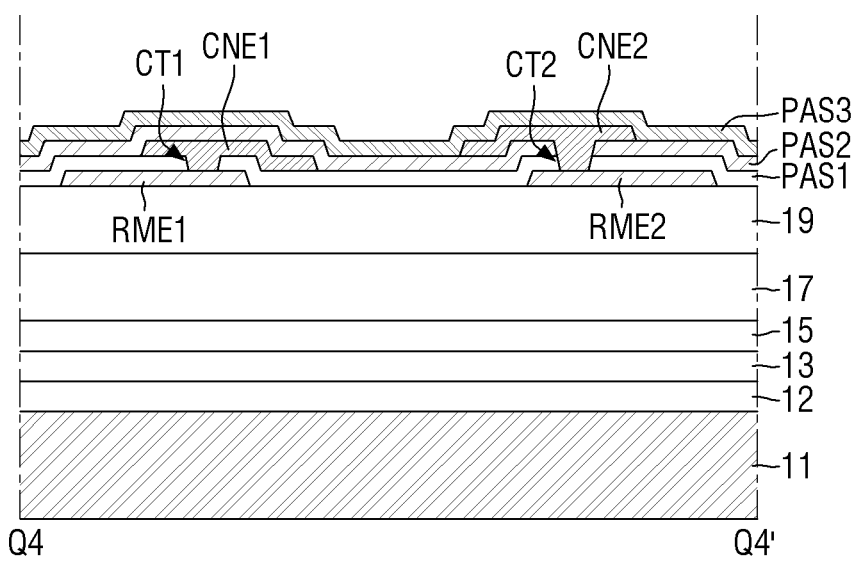
FIG. 7 is a schematic cross-sectional view taken along line Q4-Q4' of FIG. 5.

Referring to FIGS. 5 to 7 and further to FIGS. 2 and 3, the display device 10 may include the substrate 11 and a semiconductor layer, conductive layers, and insulating layers which are disposed on the substrate 11. The semiconductor layer, the conductive layers, and the insulating layers may form the transistor layer TFTL and the light-emitting element layer EML of the display device 10.

The substrate 11 may be an insulating substrate. The substrate 11 may be formed of an insulating material such as glass, quartz, or a polymer resin. The substrate 11 may be a rigid substrate or may be a flexible substrate that is bendable, foldable, or rollable.

A first conductive layer may be disposed on the substrate 11. The first conductive layer includes a lower metal layer BML, and the lower metal layer BML may be disposed to overlap an active layer ACT of a first transistor T1. The lower metal layer BML may include a material capable of blocking the transmission of light and may prevent light from being incident upon the active layer ACT of the first transistor T1. The lower metal layer BML may not be provided.

A buffer layer 12 may be disposed on the lower metal layer BML and the substrate 11. The buffer layer 12 may be formed on the substrate 11 to protect the transistors of the pixel PX from moisture that may penetrate through the substrate 11, which is vulnerable to moisture, and may perform a surface planarization function.

A semiconductor layer may be disposed on the buffer layer 12. The semiconductor layer may include the active layer ACT of the first transistor T1. The active layer ACT may be disposed to partially overlap a gate electrode G1 of a second conductive layer that will be described below.

The semiconductor layer may include polycrystalline silicon, monocrystalline silicon, or an oxide semiconductor. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

FIGS. 5 to 7 illustrate that the first subpixel SPX1 includes one transistor, for example, the first transistor T1, but the disclosure is not limited thereto. For example, the first subpixel SPX1 may include more than one transistor.

The gate insulating layer 13 is disposed on the semiconductor layer and the buffer layer 12. The gate insulating layer 13 may function as a gate insulating film for the first transistor T1.

The second conductive layer is disposed on the gate insulating layer 13. The second conductive layer may include a gate electrode G1 of the first transistor T1 and a first capacitor electrode CSE1 of a storage capacitor. The gate electrode G1 may be disposed to overlap the channel region of the active layer ACT in the thickness direction, i.e., in a third direction DR3. The first capacitor electrode CSE1 may be disposed to overlap a second capacitor electrode CSE2 in the thickness direction. In an embodiment, the first capacitor electrode CSE1 may be electrically connected to, and incorporated into (or integral with), the gate electrode G1. The first and second capacitor electrodes CSE1 and CSE2 may be disposed to overlap each other in the thickness direction, and a storage capacitor may be formed between the first and second capacitor electrodes CSE1 and CSE2.

The first interlayer insulating layer 15 is disposed on the second conductive layer. The first interlayer insulating layer 15 may function as an insulating film between the second conductive layer and layers disposed on the second conductive layer and may protect the second conductive layer. The first interlayer insulating layer 15 may be disposed to cover the second conductive layer to protect the second conductive layer. The first interlayer insulating layer 15 may be formed as an inorganic layer including an inorganic material such as silicon oxide ($SiO_x$), silicon nitride ($SiN_x$), or silicon oxynitride ($SiO_xN_y$), or as a stack of such inorganic materials.

A third conductive layer may be disposed on the first interlayer insulating layer 15. The third conductive layer may include a source electrode SE and a drain electrode DE of the first transistor T1, the data line DTL, and the second capacitor electrode CSE2.

The source electrode SE and the drain electrode DE of the first transistor T1 may contact the conductor areas ACTa and ACTb, respectively, of the active layer ACT through contact holes that penetrate the first interlayer insulating layer 15 and the gate insulating layer 13. The source electrode SE of the first transistor T1 may be electrically connected to the lower metal layer BML through another contact hole.

The data line DTL may apply data signals to another transistor (not illustrated) included in the display device 10. Although not specifically illustrated, the data line DTL may be electrically connected to, and thereby transmit signals to, the source/drain electrode of another transistor included in the display device 10.

The second capacitor electrode CSE2 may be disposed to overlap the first capacitor electrode CSE1 in the thickness direction. The second capacitor electrode CSE2 may be incorporated into, and electrically connected to the source electrode SE.

The third conductive layer may be formed as a single layer or a multi-layer including molybdenum (Mo), aluminum (Al), chromium (Cr), gold (Au), titanium (Ti), nickel (Ni), neodymium (Nd), copper (Cu), or an alloy thereof, but the disclosure is not limited thereto.

The second interlayer insulating layer 17 may be disposed on the third conductive layer. The second interlayer insulating layer 17 may function as an insulating film between the third conductive layer and other layers disposed on the third conductive layer. The second interlayer insulating layer 17 may cover and protect the third conductive layer. The second interlayer insulating layer 17 may be formed as an inorganic layer including an inorganic material such as $SiO_x$, $SiN_x$, or $SiO_xN_y$, or as a stack of such inorganic materials.

A fourth conductive layer may be disposed on the second interlayer insulating layer 17. The fourth conductive layer may include a first voltage line VL1, a second voltage line VL2, and a first conductive pattern CDP. The high-potential voltage (or the first power supply voltage), which is to be supplied to the first transistor T1, may be applied to the first voltage line VL1, and the low-potential voltage (or the second power supply voltage), which is to be supplied to a second electrode RME2, may be applied to the second voltage line VL2. Alignment signals for aligning light-emitting elements ED may be applied to the second voltage line VL2 during the fabrication of the display device 10.

The first conductive pattern CDP may be electrically connected to the second capacitor electrode CSE2 through a contact hole that is formed in the second interlayer insulating layer 17. The second capacitor electrode CSE2 may be incorporated into the source electrode SE of the first transistor T1, and the first conductive pattern CDP may be electrically connected to the source electrode SE. The first conductive pattern CDP may contact a first electrode RME1, and the first transistor T1 may transmit the first power supply voltage applied thereto from the first voltage line VL1 to the first electrode RME1 through the first conductive pattern CDP.

The fourth conductive layer is illustrated as including one first voltage line VL1 and one second voltage line VL2, but the disclosure is not limited thereto. As another example, the fourth conductive layer may include more than one first voltage line VL1 and more than one second voltage line VL2. In another example, the third conductive layer may transmit signals such as power supply voltages, in which case, the fourth conductive layer and the second interlayer insulating layer 17 may not be provided. For example, the first voltage line VL1 and the second voltage line VL2 may be formed of the third conductive layer, and the first conductive pattern CDP may not be provided.

The fourth conductive layer may be formed as a single layer or a multi-layer including Mo, Al, Cr, Au, Ti, Ni, Nd, Cu, or an alloy thereof, but the disclosure is not limited thereto.

The via layer 19 may be disposed on the fourth conductive layer. The via layer 19 may include an organic insulating material such as PI and may perform a surface planarization function.

Partitions WA, electrodes RME, the bank BNL, light-emitting elements ED, and connecting electrodes CNE (e.g., first and second connecting electrodes CNE1 and CNE2) may be disposed on the via layer 19 as the light-emitting element layer EML. First, second, and third insulating layers PAS1, PAS2, and PAS3 may also be disposed on the via layer 19.

The electrodes RME may be disposed on the via layer 19. The electrodes RME may include the first and second electrodes RME1 and RME2. The first and second electrodes RME1 and RME2 may extend in the second direction DR2 and may be disposed to be spaced from each other in the first direction DR1.

The electrodes RME may extend in the second direction DR2, within the first subpixel SPX1, and may be separated from other electrodes RME in the subarea SA of the first subpixel SPX1. In an example, referring to a pair of adjacent subpixels SPXn in the second direction DR2, one subarea SA may be disposed between two emission areas, and a set of first and second electrodes RME1 and RME2 may be separated from another set of first and second electrodes RME1 and RME2, in the subarea SA. However, the disclosure is not limited thereto. As another example, some of the electrodes RME, (e.g., at least one of the first and second electrodes RME1 and RME2 of the first subpixel SPX1) may extend in the second direction DR2 beyond the first subpixel SPX1 without being divided between different subpixels SPXn.

The first electrode RME1 may be electrically connected to the first transistor T1 through a first electrode contact hole CTD, and the second electrode RME2 may be electrically connected to the second voltage line VL2 through a second electrode contact hole CTS. For example, the first electrode RME1 may contact the first conductive pattern CDP through the first electrode contact hole CTD, which penetrates the via layer 19, in a portion of the bank BNL that extends in the first direction DR1, and the second electrode RME2 may contact the second voltage line VL2 through the second electrode contact hole CTS, which penetrates the via layer 19, in the portion of the bank BNL that extends in the first direction DR1. However, the disclosure is not limited thereto. As another example, the first and second electrode contact holes CTD and CTS may be disposed in the emission area EMA surrounded by the bank BNL not to overlap the bank BNL. In an embodiment, the second electrode RME2 may directly contact the third conductive layer so that voltages may be applied to the second electrode RME2.

FIG. 5 illustrates that the first subpixel SPX1 includes a first electrode RME1 and a second electrode RME2, but the disclosure is not limited thereto. As another example, the first subpixel SPX1 may include more than one first electrode RME1 and more than one second electrode RME2. The first and second electrodes RME1 and RME2 may not necessarily extend in a direction in the first subpixel SPX1, and the layout of the first and second electrodes RME1 and RME2 may vary. For example, the first and second electrodes RME1 and RME2 may be curved or bent in part, and one of the first and second electrodes RME1 and RME2 may be disposed to surround the other electrode.

The electrodes RME may include a conductive material with high reflectance. For example, the electrodes RME may include a metal with high reflectance such as silver (Ag), Cu, or Al, or an alloy of Al, Ni, or lanthanum (La). The electrodes RME may reflect light, emitted by the light-emitting elements ED, in an upward direction of the first subpixel SPX1.

However, the disclosure is not limited thereto, and the electrodes RME may further include a transparent conductive material. For example, the electrodes RME may include a material such as ITO, IZO, or ITZO. In some embodiments, the electrodes RME may be formed as a stack of one or more layers of a transparent conductive material and one or more layers of a metal with high reflectance or as a single layer including the transparent conductive material and the metal with high reflectance. For example, the electrodes RME may have a stack structure such as ITO/Ag/ITO, ITO/Ag/IZO, or ITO/Ag/ITZO/IZO.

The electrodes RME may be electrically connected to the light-emitting elements ED, and predetermined voltages may be applied to the electrodes RME such that the light-emitting elements ED may emit light. The electrodes RME may be electrically connected to the light-emitting elements ED through the connecting electrodes CNE, and electric signals applied to the electrodes RME may be transmitted to the light-emitting elements ED through the connecting electrodes CNE.

One of the first and second electrodes RME1 and RME2 may be electrically connected to anodes of the light-emitting elements ED, and the other electrode may be electrically connected to cathodes of the light-emitting elements ED. However, the disclosure is not limited thereto. The first and second electrodes RME1 and RME2 may be in a reversed configuration.

The electrodes RME may be used to form an electric field in the first subpixel SPX1 to align the light-emitting elements ED. The light-emitting elements ED may be disposed between the first and second electrodes RME1 and RME2 by the electric field formed on the first and second electrodes RME1 and RME2. The light-emitting elements ED may be sprayed onto the electrodes RME by inkjet printing. Ink including the light-emitting elements ED is sprayed onto the electrodes RME, and an electric field is formed by applying alignment signals to the electrodes RME. The light-emitting elements ED dispersed in the ink may be aligned on the electrodes RME by receiving a dielectrophoretic force from the electric field formed on the electrodes RME.

The first insulating layer PAS1 may be disposed on the via layer 19. The first insulating layer PAS1 may be disposed to cover the first and second electrodes RME1 and RME2. The first insulating layer PAS1 may protect the first and second electrodes RME1 and RME2 and may insulate the first and second electrodes RME1 and RME2 from each other. The first insulating layer PAS1 may prevent the light-emitting elements ED disposed thereon from being damaged by directly contacting other members.

The top surface of the first insulating layer PAS1 may be formed to be recessed in part between the electrodes RME, which are spaced apart from each other in the first direction DR1. The light-emitting elements ED may be disposed on a recessed portion of the top surface of the first insulating layer PAS1, and gaps may be formed between the first insulating layer PAS1 and the light-emitting elements ED.

The first insulating layer PAS1 may include first and second contacts CT1 and CT2 which expose parts of the top surfaces of the electrodes RME. The first and second contacts CT1 and CT2 may penetrate the first insulating layer PAS1, and the connecting electrodes CNE may contact the electrodes RME, exposed through the first and second contacts CT1 and CT2.

The bank BNL may be disposed on the first insulating layer PAS1. The bank BNL may include parts that extend in the first direction DR1 and parts that extend in the second direction DR2 in a plan view, and may be arranged in a lattice shape. The bank BNL may be disposed along the boundaries of the first subpixel SPX1 to separate the first subpixel SPX1 from other adjacent subpixels SPXn. The bank BNL may be disposed to surround the emission area EMA and the subarea SA of the first subpixel SPX1, and areas partitioned and opened by the bank BNL may be the emission area EMA and the subarea SA of the first subpixel SPX1.

The bank BNL may prevent ink from spilling over or overflowing into a space between neighboring subpixels SPXn during inkjet printing in the fabrication of the display device 10. The bank BNL may prevent ink having different sets of light-emitting elements ED for different subpixels SPXn from being mixed with each other. The surface of the bank BNL may be hydrophobically treated to prevent ink from spilling over between neighboring subpixels SPXn. The bank BNL may include a black matrix material capable of absorbing light. A black matrix may include an organic material containing a black pigment and may thus be able to absorb light. As the bank BNL includes the black matrix material, the bank BNL can prevent color mixing by absorbing light emitted between neighboring subpixels SPXn.

The light-emitting elements ED may be disposed on the first insulating layer PAS1. Each of the light-emitting elements ED may include semiconductor layers that are arranged in a direction parallel to the top surface of the substrate 11. The light-emitting elements ED may be arranged such that the direction in which the light-emitting elements ED extend may be parallel to the substrate 11, and the semiconductor layers included in each of the light-emitting elements ED may be sequentially arranged in a direction parallel to the top surface of the substrate 11. However, the disclosure is not limited thereto. As another example, in case that the light-emitting elements ED have a different structure, the semiconductor layers included in each of the light-emitting elements ED may be arranged in a direction perpendicular to the substrate 11.

The light-emitting elements ED may be disposed on the electrodes RME, which are spaced apart from each other in the first direction DR1, between parts of the partition WA. The light-emitting elements ED may be spaced apart from each other in the direction in which the light-emitting elements ED extend, e.g., in the second direction DR2, and may be aligned substantially in parallel to one another. The light-emitting elements ED may extend in a direction, and the length of the light-emitting elements ED may be greater than the minimum distance, in the first direction DR1, between the electrodes RME. At least one end portion of each of the light-emitting elements ED may be disposed on one of the electrodes RME, or both end portions of each of the light-emitting elements ED may be disposed on different electrodes RME. The direction in which the electrodes RME extend and the direction in which the light-emitting elements ED extend may be substantially perpendicular to each other, but the disclosure is not limited thereto. As another example, the light-emitting elements ED may be arranged diagonally with respect to the direction in which the electrodes RME extend.

Each of the light-emitting elements ED disposed in each sub pixel SPXn may include semiconductor layers, and the wavelength of light emitted by each of the light-emitting elements ED may vary depending on the material of the semiconductor layers. However, the disclosure is not limited thereto, and the material of the semiconductor layers of each of the light-emitting elements ED may be uniform so that the light-emitting elements ED may emit light of the same color. Each of the light-emitting elements ED may include semiconductor layers that are doped with dopants of different conductivity types, and may be aligned by the electric field formed on the electrodes RME such that end portions of the light-emitting elements ED may face a particular direction. First end portions and second end portions of the light-emitting elements ED may be defined based on one of the semiconductor layers included in each of the light-emitting elements ED. For example, end portions of the light-emitting elements ED that are placed on the first electrode RME1 may be first end portions, and end portions of the light-emitting elements ED that are placed on the second electrode RME2 may be second end portions. In an embodiment where the display device 10 includes more than two electrodes in the first subpixel SPX1, the first end portions of light-emitting elements ED disposed on different electrodes RME may face different directions.

The light-emitting elements ED may contact, and electrically connected to, the connecting electrodes CNE. As some of the semiconductor layers of each of the light-emitting elements ED are exposed on an end surface of the corresponding light-emitting element ED, the exposed semiconductor layers may contact the connecting electrodes CNE. The light-emitting elements ED may be electrically connected to the electrodes RME and the conductive layers below the via layer 19 through the connecting electrodes CNE, and in response to electric signals being applied, the light-emitting elements ED may emit light of a particular wavelength range.

The partition WA may be directly on the first insulating layer PAS1 and the light-emitting elements ED. The partition WA may have a shape obtained by connecting parts that extend in the first direction DR1 and parts that extend in the second direction DR2. The parts of the partition WA that extend in the first direction DR1 may be spaced apart from one another, and the parts of the partition WA that extend in the second direction DR2 may be spaced apart from one another. The partition WA may be disposed in an area surrounded by the bank BNL, in the middle or center of the emission area EMA.

The partition WA may include a first part WAA, which overlaps the light-emitting elements ED, second parts WAV, which are disposed adjacent to one another with the first parts WAA disposed (or interposed) therebetween, and third parts WAH, which connect the first part WAA and the second parts WAV.

The first part WAA may be part of the partition WA that extends in the second direction DR2 and overlaps the light-emitting elements ED. For example, the first part WAA may be disposed in the middle of the emission area EMA. The first part WAA may be disposed directly on the light-emitting elements ED to fix and protect the light-emitting elements ED. The first part WAA may be disposed to surround parts of outer surfaces of the light-emitting elements ED, but not to cover both sides or both end portions of each of the light-emitting elements ED. Portions of the first part WAA that are disposed on the light-emitting elements ED may extend in the second direction DR2, on the first insulating layer PAS1. The first part WAA may protect and fix the light-emitting elements ED during the fabrication of the display device 10. The first part WAA may be disposed to fill the gaps between the first insulating layer PAS1 and the light-emitting elements ED. The first part WAA may be disposed on the first insulating layer PAS1 to expose both sides of each of the light-emitting elements ED and parts of areas where the electrodes RME are disposed. Although not specifically illustrated, the first part WAA may also be disposed in part in the subarea SA, but may be removed from a separation part ROP of the subarea SA together with the first insulating layer PAS1, during the formation of the electrodes RME.

The first part WAA may be disposed to overlap the connecting electrodes CNE, but not to overlap the electrodes RME, but the disclosure is not limited thereto. As another example, the first part WAA may be disposed to overlap the connecting electrodes CNE and the electrodes RME. The first part WAA may have a predetermined width in the first direction DR1, and the width of the first part WAA may be smaller than the length, in the first direction DR1, of the light-emitting elements ED. The width of the first part WAA may be smaller than the width of first and second extensions WAV1 and WAV2, but the disclosure is not limited thereto. As another example, the width of the first part WAA may be the same as the width of the first and second extensions WAV1 and WAV2.

The second parts WAV may include the first and second extensions WAV1 and WAV2. The first extension WAV1 may be part of the partition WA that extends in the second direction DR2 and overlaps the first electrode RME1. The second extension WAV2 may be part of the partition WA that extends in the second direction DR2 and overlaps the second electrode RME2. For example, the first extension WAV1 may be disposed in a left portion of the emission area EMA, and the second extension WAV2 may be disposed in a right portion of the emission area EMA. The first and second extensions WAV1 and WAV2 may extend in parallel to the direction in which the electrodes RME and the connecting electrodes CNE extend. The first and second extensions WAV1 and WAV2 may be spaced apart from each other with the light-emitting elements ED interposed therebetween and may be disposed not to overlap the light-emitting elements ED. In an embodiment, the first and second extensions WAV1 and WAV2 may not overlap the bank BNL and may be spaced from the bank BNL in a plan view.

The first and second extensions WAV1 and WAV2 may each have a predetermined width in the first direction DR1, and the width of each of the first and second extensions WAV1 and WAV2 may be smaller than the width of the electrodes RME. In an embodiment, the first and second extensions WAV1 and WAV2 may completely overlap the first and second electrodes RME1 and RME2, respectively. The first and second extensions WAV1 and WAV2 may be spaced apart from each other in the first direction DR1, and the distance between the first and second extensions WAV1 and WAV2 may be greater than the length, in the first direction DR1, of the light-emitting elements ED.

The third parts WAH may include first and second connectors WAH1 and WAH2, which extend in the first direction DR1 and are spaced apart from each other in the second direction DR2.

The first connector WAH1 may be part of the partition WA that extends in the first direction DR1 and is adjacent to the first and second electrode contact holes CTD and CTS. The second connector WAH2 may be part of the partition WA that extends in the first direction DR1 and is spaced apart from the first connector WAH1 in the opposite direction of the second direction DR2. For example, the first connector WAH1 may be disposed in the upper part of the emission area EMA, and the second connector WAH2 may be disposed in the lower part of the emission area EMA. The first and second connectors WAH1 and WAH2 may be arranged in parallel to the direction in which the light-emitting elements ED extend, and may be disposed not to overlap the light-emitting elements ED. The first and second connectors WAH1 and WAH2 may be disposed to overlap the electrodes RME and the connecting electrodes CNE. The first and second connectors WAH1 and WAH2 may not overlap the bank BNL and may be spaced apart from the bank BNL in a plan view.

The first part WAA, the second parts WAV, and the third parts WAH may be integral with each other. The first part# WAA, the second parts WAV, and the third parts WAH may be formed to be continuously electrically connected to each other. As will be described below, the first part WAA, the second parts WAV, and the third parts WAH may be formed at the same time by patterning an organic material.

The partition WA may protrude at least in part beyond the top surface of the via layer 19. Each of protruding parts of the partition WA may have inclined or curved side surfaces. As another example, the partition WA may have a curved semicircular or semielliptical shape in a cross-sectional view. The partition WA may include an organic insulating material such as PI, but the disclosure is not limited thereto.

The partition WA may have a predetermined height, and the first part WAA of the partition WA may have a predetermined height to fix the light-emitting elements ED. The vertical distances from the top surface of the first electrode RME1 to the top surfaces of the first part WAA, the second parts WAV, and the third parts WAH may be the same. A vertical distance H1 from the top surface of the first electrode RME1 to the top surface of the first extension WAV1 may be the same as a vertical distance H2 from the top surface of the first electrode RME1 to the top surface of the first part WAA. As already mentioned above, parts of the first partition WA may all be formed at the same time by patterning an organic material, and as a result, the top surfaces of the first and second extensions WAV1 and WAV2 and the top surface of the first part WAA may be located at the same height from the top surface of the first electrode RME1.

The partition WA may be formed after the application of ink including the light-emitting elements ED and the alignment of the light-emitting elements ED. Once the ink is applied to the emission area EMA partitioned by the bank BNL, the volume of ink that can be applied may be determined in accordance with the volume of the emission area EMA. As the partition WA is formed after the alignment of the light-emitting elements ED, the volume of ink that can be applied onto the emission area EMA before the formation of the partition WA can be increased. As a result, the number of light-emitting elements that can be aligned in the emission area EMA can be increased, and thus, luminance can be improved.

The partition WA may be formed by dry etching using a hard mask and may thus have a large tapered angle. The first and second connectors WAH1 and WAH2, the first and second extensions WAV1 and WAV2, and the first part WAA may have the same tapered angle. A tapered angle $\theta 1$ of the second extension WAV2 may be the same as a tapered angle $\theta 2$ of the first part WAA.

As the partition WA has a large tapered angle and can increase the volume of ink that can be applied, the height of the partition WA is not particularly limited. In an embodiment, the vertical distance H1 from the top surface of the first electrode RME1 to the top surface of the first extension WAV1 may be the same as a vertical distance H3 from the top surface of the first electrode RME1 to the top surface of the bank BNL. In this case, as the height of the partition WA can be reduced to as low as the height of the bank BNL, the cell gap between the light-emitting element layer EML and the wavelength conversion layer WLCL (see FIG. 2) can be reduced, and a thin display device 10 can be implemented.

However, the disclosure is not limited thereto. As another example, as illustrated in FIG. 8, the height of the partition WA may be greater than the height of the bank BNL. For example, the vertical distance H1 from the top surface of the first electrode RME1 to the top surface of the first extension WAV1 may be greater than the vertical distance H3 from the top surface of the first electrode RME1 to the top surface of the bank BNL, and the vertical distance H2 from the top surface of the first electrode RME1 to the top surface of the first part WAA may also be greater than the vertical distance H3 from the top surface of the first electrode RME1 to the top surface of the bank BNL.

As another example, as illustrated in FIG. 9, the height of the partition WA may be smaller than the height of the bank BNL. For example, the vertical distance H1 from the top surface of the first electrode RME1 to the top surface of the first extension WAV1 may be smaller than the vertical distance H3 from the top surface of the first electrode RME1 to the top surface of the bank BNL, and the vertical distance H2 from the top surface of the first electrode RME1 to the top surface of the first part WAA may also be smaller than the vertical distance H3 from the top surface of the first electrode RME1 to the top surface of the bank BNL The connecting electrodes CNE, the second insulating layer PAS2, and the third insulating layer PAS3 may be disposed on the partition WA, but the disclosure is not limited thereto. The third insulating layer PAS3 may not be provided.

The connecting electrodes CNE may be disposed on the light-emitting elements ED, the electrodes RME, and the partition WA. The connecting electrodes CNE may be disposed in part on the first part WAA of the partition WA and may be insulated from each other by the first part WAA and the second insulating layer PAS2. The connecting electrodes CNE may contact the light-emitting elements ED and the electrodes RME. The connecting electrodes CNE may directly contact the semiconductor layers exposed on both end surfaces of each of the light-emitting elements ED and contact at least one of the electrodes RME through the first and second contacts CT1 and CT2, which penetrate the first and second insulating layers PAS1 and PAS2. Both end portions of each of the light-emitting elements ED may be electrically connected to the electrodes RME through the connecting electrodes CNE.

A first connecting electrode CNE1 may extend in the second direction DR2 and may be disposed on the first electrode RME1 and the partition WA. Part of the first connecting electrode CNE1 may overlap the first electrode RME1 and the first extension WAV1, and another part of the first connecting electrode CNE1 may overlap the first part WAA of the partition WA. The first connecting electrode CNE1 may contact the first electrode RME1 through the first contact CT1, which exposes the top surface of the first electrode RME1, and may also contact the first end portions of the light-emitting elements ED.

A second connecting electrode CNE2 may extend in the second direction DR2 and may be disposed on the second electrode RME1 and the partition WA. Part of the second connecting electrode CNE2 may overlap the second electrode RME2 and the second extension WAV2, and another part of the second connecting electrode CNE2 may overlap the first part WAA of the partition WA. The second connecting electrode CNE2 may contact the second electrode RME2 through the second contact CT2, which exposes the top surface of the second electrode RME2, and may also contact the second end portions of the light-emitting elements ED.

The first and second connecting electrodes CNE1 and CNE2 may transmit electric signals applied to the first and second electrodes RME1 and RME2 to the light-emitting elements ED. The electric signals may be applied directly to the light-emitting elements ED. The first and second connecting electrodes CNE1 and CNE2 may be spaced apart from each other in a plan view. The first and second connecting electrodes CNE1 and CNE2 may be disposed not to contact each other, and electric signals applied to the connecting electrodes CNE may flow through the light-emitting elements ED.

The first and second connecting electrodes CNE1 and CNE2 may be disposed in different layers. The first connecting electrode CNE1 may be disposed below the second insulating layer PAS2, and the second connecting electrode CNE2 may be disposed on the second insulating layer PAS2. The first and second connecting electrodes CNE1 and CNE2 may be spaced apart from each other and may be insulated from each other by the second insulating layer PAS2, but the disclosure is not limited thereto. As another example, the second insulating layer PAS2 may not be provided, and the first and second connecting electrodes CNE1 and CNE2 may be disposed directly on the same layer. In this case, as the first and second connecting electrodes CNE1 and CNE2 are spaced from each other by a predetermined distance, the first and second connecting electrodes CNE1 and CNE2 may not be directly connected to each other.

The connecting electrodes CNE may have a relatively large width in areas where the first and second contacts CT1 and CT2 are disposed. The connecting electrodes CNE may contact the electrodes RME through the first and second contacts CT1 and CT2, which penetrate the first insulating layer PAS1 alone or both the first and second insulating layers PAS1 and PAS2.

The first and second contacts CT1 and CT2 may be formed to be spaced apart from the region where the light-emitting elements ED are disposed, in the second direction DR2, not to overlap the light-emitting elements ED in the first direction DR1. FIG. 5 illustrates that the first and second contacts CT1 and CT2 are disposed in the subarea SA, but the disclosure is not limited thereto. As another example, the first and second contacts CT1 and CT2 may be formed in a region where the light-emitting elements ED are not disposed, in the emission area EMA.

The connecting electrodes CNE may include a conductive material. The connecting electrodes CNE may include ITO, IZO, ITZO, or Al. For example, the connecting electrodes CNE may include a transparent conductive material, and light emitted by the light-emitting elements ED may proceed toward the electrodes RME through the connecting electrodes CNE. However, the disclosure is not limited thereto.

The second insulating layer PAS2 may be disposed on the first connecting electrode CNE1, the partition WA, and the bank BNL. The second insulating layer PAS2 may be disposed to cover the first connecting electrode CNE1. The second insulating layer PAS2 may be disposed on the entire surface of the via layer 19, except for a region where the second connecting electrode CNE2 is disposed. For example, the second insulating layer PAS2 may be disposed not only on the first insulating layer PAS1, but also on the partition WA and the bank BNL.

The third insulating layer PAS3 may be disposed on the second connecting electrode CNE2, the second insulating layer PAS2, and the partition WA. The third insulating layer PAS3 may be disposed on the entire surface of the via layer 19 to cover the second connecting electrode CNE2, the second insulating layer PAS2, and the partition WA.

The first, second, and third insulating layers PAS1, PAS2, and PAS3 may include an inorganic insulating material or an organic insulating material, but the disclosure is not limited thereto.

FIG. 10 is a schematic perspective view of a light-emitting element according to an embodiment.

Referring to FIG. 10, a light-emitting element ED may be a light-emitting diode (LED), particularly, an ILED having a size of several nanometers or micrometers and formed of an inorganic material. If an electric field is formed in a particular direction between two opposite electrodes, the light-emitting element ED may be aligned between the two electrodes where polarities are formed.

The light-emitting element ED may extend in a direction. The light-emitting element ED may have the shape of a cylinder, a rod, a wire, or a tube, but the shape of the light-emitting element ED is not particularly limited. As another example, the light-emitting element ED may have the shape of a polygonal column such as a regular cube, a rectangular parallelepiped, or a hexagonal column or may extend in a direction but have a partially inclined outer surface.

The light-emitting element ED may include semiconductor layers doped with impurities of an arbitrary conductivity type (e.g., a p type or an n type). The semiconductor layers may receive electrical signals from an external power source to emit light of a particular wavelength range. The light-emitting element ED may include a first semiconductor layer 31, a second semiconductor layer 32, a light-emitting layer 36, an electrode layer 37, and the insulating film 38.

The first semiconductor layer 31 may include an n-type semiconductor. The first semiconductor layer 31 may include a semiconductor material, for example, $Al_xGa_yIn_{1-x-y}N$ (where $0\leq x\leq 1$, $0\leq y\leq 1$, and $0\leq x+y\leq 1$). For example, the first semiconductor layer 31 may include at least one of AlGaInN, GaN, AlGaN, InGaN, AlN, and InN that are doped with an n-type dopant. The n-type dopant may be Si, Ge, or Sn.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material, e.g., $Al_xGa_yIn_{1-x-y}N$ (where $0\leq x\leq 1$, $0\leq y\leq 1$, and $0\leq x+y\leq 1$). In an example, the second semiconductor layer 32 may include at least one of AlGaInN, GaN, AlGaN, InGaN, AlN, and InN that are doped with a p-type dopant. The p-type dopant may be Mg, Zn, Ca, Se, or Ba.

FIG. 10 illustrates that the first and second semiconductor layers 31 and 32 are formed as single layers, but the disclosure is not limited thereto. As another example, each of the first and second semiconductor layers 31 and 32 may include more than a layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a material having a single- or multi-quantum well structure. In case that the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. The light-emitting layer 36 may include a material such as AlGaN or AlGaInN. In particular, in case that the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN.

The light-emitting layer 36 may have a structure in which a semiconductor material having a large band gap energy and a semiconductor material having small band gap energy are alternately stacked or may include group III to V semiconductor materials depending on the wavelength of light to be emitted. The type of light emitted by the light-emitting layer 36 is not particularly limited. In some embodiments, the light-emitting layer 36 may emit light of a red or green wavelength range as desired, instead of blue light.

The electrode layer 37 may be an ohmic connecting electrode, but the disclosure is not limited thereto. As another example, the electrode layer 37 may be a Schottky connecting electrode. The light-emitting element ED may include at least one electrode layer 37. The light-emitting element ED may include more than an electrode layer 37, but the disclosure is not limited thereto. As another example, the electrode layer 37 may not be provided.

The electrode layer 37 may reduce the resistance between the light-emitting element ED and electrodes RME or (connecting electrodes CNE) in case that the light-emitting element ED is electrically connected to the electrodes RME or (the connecting electrodes CNE). The electrode layer 37 may include a conductive metal. For example, the electrode layer 37 may include at least one of Al, Ti, In, Au, Ag, ITO, IZO, and ITZO.

The insulating film 38 may be disposed to surround the first and second semiconductor layers 31 and 32 and the electrode layer 37. For example, the insulating film 38 may be disposed to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as silicon oxide ($SiO_x$), silicon nitride ($SiN_x$), silicon oxynitride ($SiO_xN_y$), aluminum nitride ($AlN_x$), or aluminum oxide ($AlO_x$). The insulating film 38 is illustrated as being a single-layer film, but the disclosure is not limited thereto. In some embodiments, the insulating film 38 may be formed as a multi-layer film in which multiple layers are stacked.

The insulating film 38 may protect the other elements of the light-emitting element ED. The insulating film 38 can prevent any short circuit that may occur in the light-emitting element 36 in case that the light-emitting element ED directly contacts electrodes to which electrical signals are applied. The insulating film 38 can prevent the degradation of the emission efficiency of the light-emitting element ED.

The outer surface of the insulating film 38 may be subjected to surface treatment. The light-emitting element ED may be sprayed on electrodes while being dispersed in ink. The surface of the insulating film 38 may be hydrophobically or hydrophilically treated to keep the light-emitting element ED dispersed in ink without agglomerating with other neighboring light-emitting elements ED.

FIGS. 11 to 17 are schematic cross-sectional views or schematic plan views illustrating a method of fabricating a display device according to an embodiment. FIGS. 11 to 17 illustrate some of the processes of the method of fabricating a display device according to an embodiment.

Figure 11:
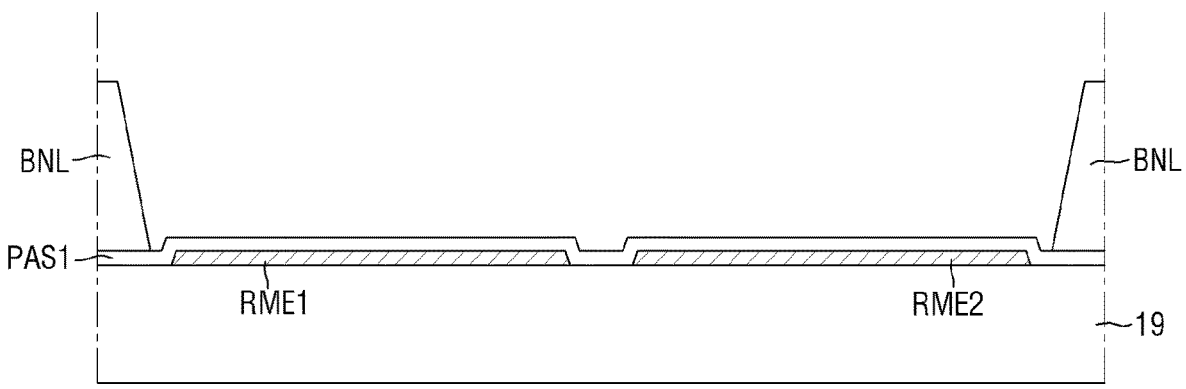

Referring to FIG. 11, first and second electrodes RME1 and RME2 are formed on a via layer 19 to extend in a direction. The first and second electrodes RME1 and RME2 may be used to align light-emitting elements ED and may be divided later. A first insulating layer PAS1 is formed on the first and second electrodes RME1 and RME2. The first insulating layer PAS1 may cover the first and second electrodes RME1 and RME2 and may be disposed on the entire surface of the via layer 19. Thereafter, a bank BNL is formed on the first insulating layer PAS1.

Figure 12:
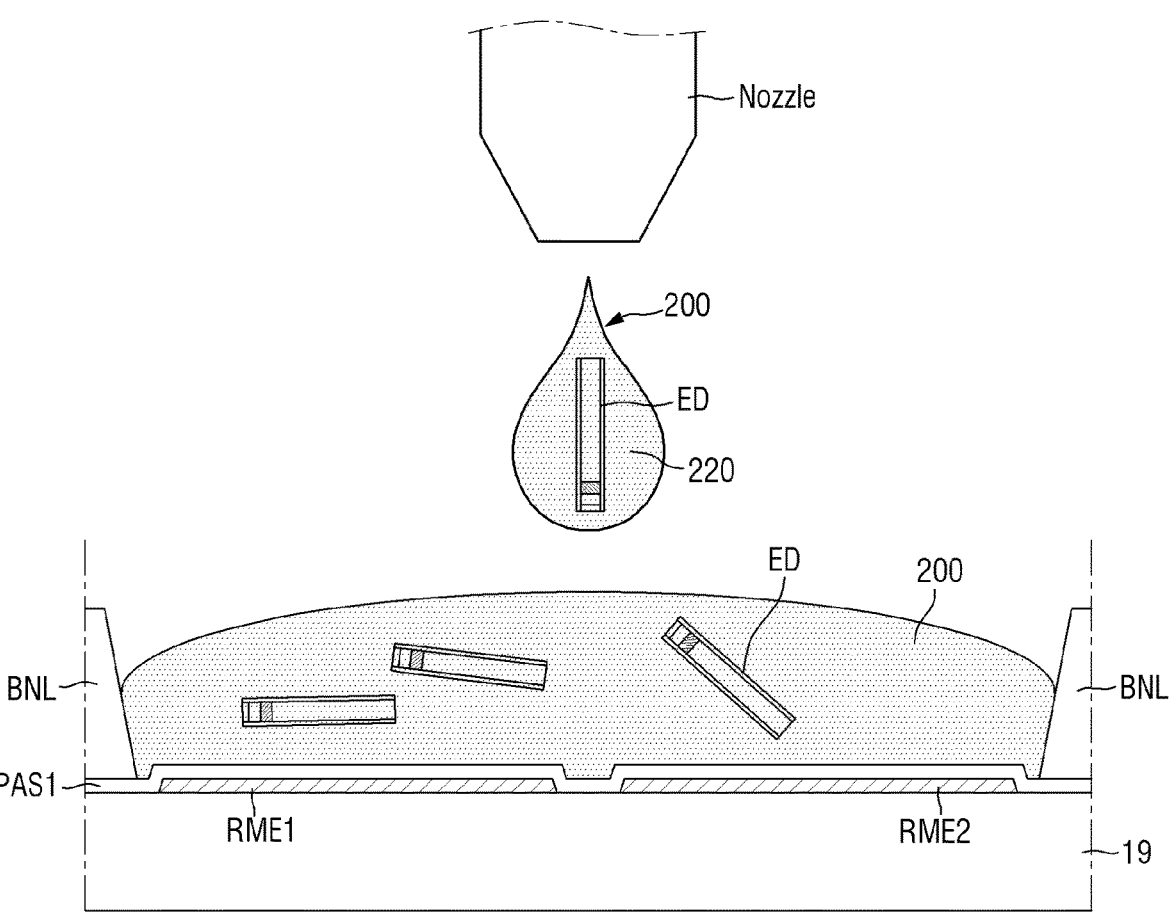

Thereafter, referring to FIG. 12, ink 200 including light-emitting elements ED is sprayed onto the first insulating layer PAS1, partitioned by the bank BNL. The ink 200 may include a solvent 220 and light-emitting elements ED dispersed in the solvent 220. The light-emitting elements ED may be evenly dispersed in the solvent 220.

The ink 200 may be sprayed onto the first insulating layer PAS1 by printing using an inkjet printing device. The ink 200 may be sprayed through nozzles of an inkjet head of the inkjet printing device. The ink 200, sprayed through the nozzles, may be seated on the first insulating layer PAS1 where the first and second electrodes RME1 and RME2 are formed. The light-emitting elements ED may extend in a direction and may be randomly dispersed in the ink 200. Once the ink 200 is sprayed onto the first insulating layer PAS1, the ink 200 can be applied inside the bank BNL without spilling over the bank BNL.

Figure 13:
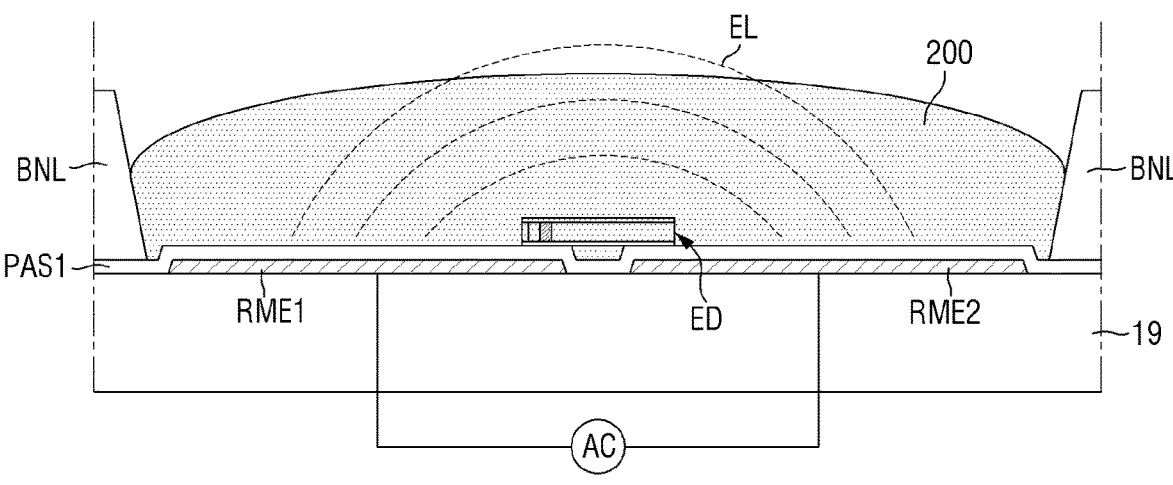

Thereafter, referring to FIG. 13, the light-emitting elements ED are aligned by applying alignment signals to the first and second electrodes RME1 and RME2 to form an electric field EL. The light-emitting elements ED, dispersed in the solvent 220, may receive a dielectrophoretic force from the electric field EL and may thus be placed on the first and second electrodes RME1 and RME2 with their alignment directions and locations continuing to change.

Once the electric field EL is formed, the light-emitting elements ED may receive a dielectrophoretic force. If the electric field EL is formed in parallel to the top surface of the via layer 19, the light-emitting elements ED may be aligned such that the direction in which the light-emitting elements ED extend may be parallel to the via layer 19, and as a result, the light-emitting elements ED may be disposed on the first and second electrodes RME1 and RME2. The light-emitting elements ED may move from their initial locations toward the first and second electrodes RME1 and RME2 due to the dielectrophoretic force. As the locations and the alignment directions of the light-emitting elements ED continue to be changed by the electric field EL, both end portions of each of the light-emitting elements ED may be placed on the first and second electrodes RME1 and RME2. Each of the light-emitting elements ED may include semiconductor layers that are doped with dopants of different conductivity types, and may have a dipole moment. In case that placed on the electric field EL, the light-emitting elements ED with a dipole moment may receive a dielectrophoretic force and may thus be aligned to have both end portions thereof placed on the first and second electrodes RME1 and RME2, respectively.

Thereafter, the solvent 220 is removed by a thermal treatment process. The thermal treatment process may be performed in a chamber whose internal power is controllable. The chamber can control the pressure therein and can remove the solvent 220 by applying heat thereto with the pressure controlled. According to the embodiment of FIGS. 11 to 17, the solvent 220 can be completely removed by the thermal treatment process in a low pressure environment. The removal of the solvent 220 may be performed at a pressure of about $10^{-4}$ Torr to about 1 Torr and a temperature of about 25° C. to about 150° C. In this case, the boiling point of the solvent 220 may decrease so that the solvent 220 may become easily removable. The thermal treatment process may be performed in the chamber for about 1 minute to about 30 minutes, but the disclosure is not limited thereto.

Figure 14:
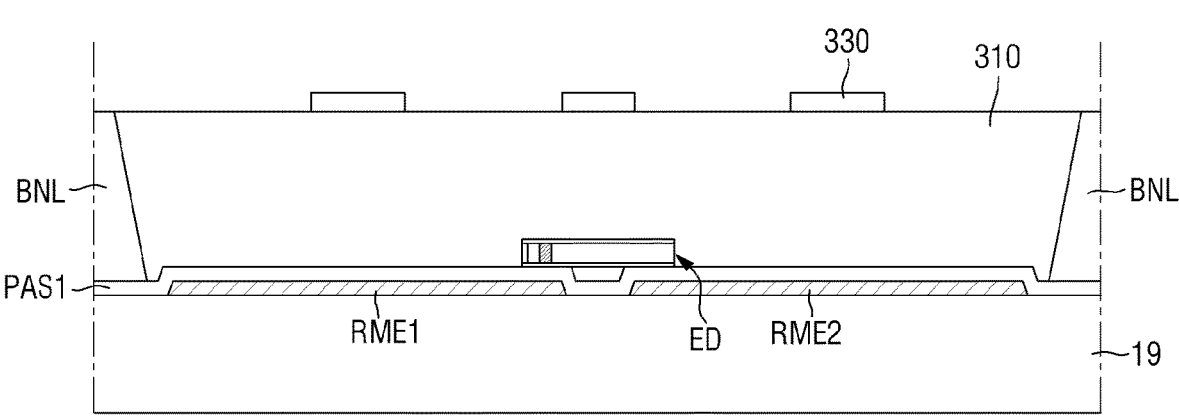

Thereafter, referring to FIG. 14, an organic material layer 310 is applied on the first insulating layer PAS1 partitioned by the bank BNL and on the light-emitting elements ED. The organic material layer 310 may be formed by a solution process such as spin coating, slit coating, or inkjet printing. The organic material layer 310 may be formed of PI, but the disclosure is not limited thereto.

Thereafter, a hard mask 330 for forming a partition WA is formed on the organic material layer 310. The hard mask 330 may be formed of an inorganic material such as ITO. The hard mask 330 and the partition WA may be formed to have the same planar shape.

Figure 15:
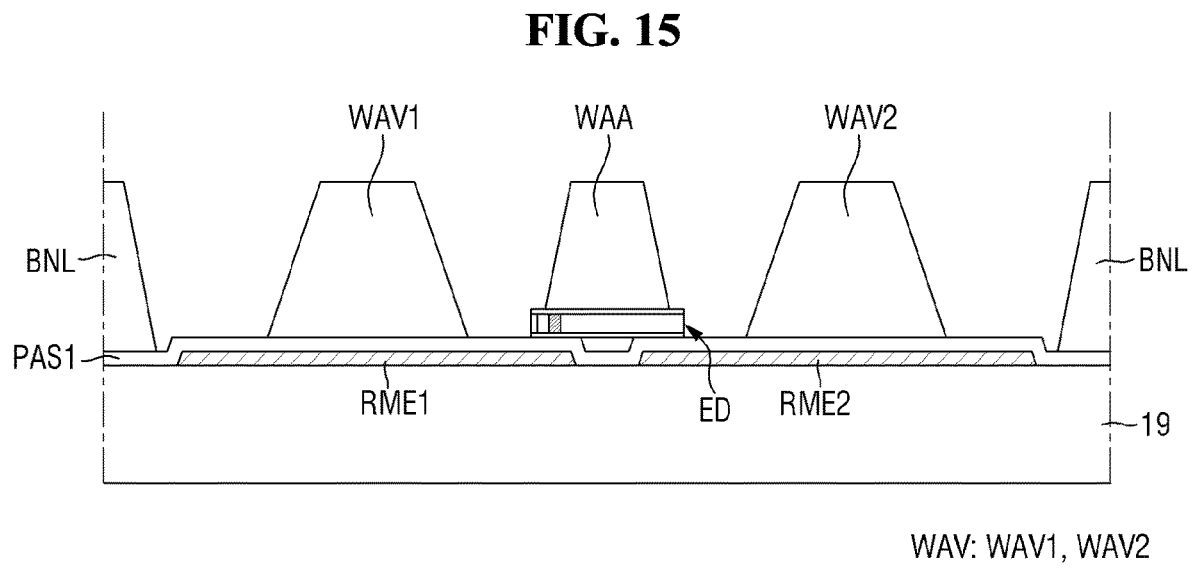
Figure 16:
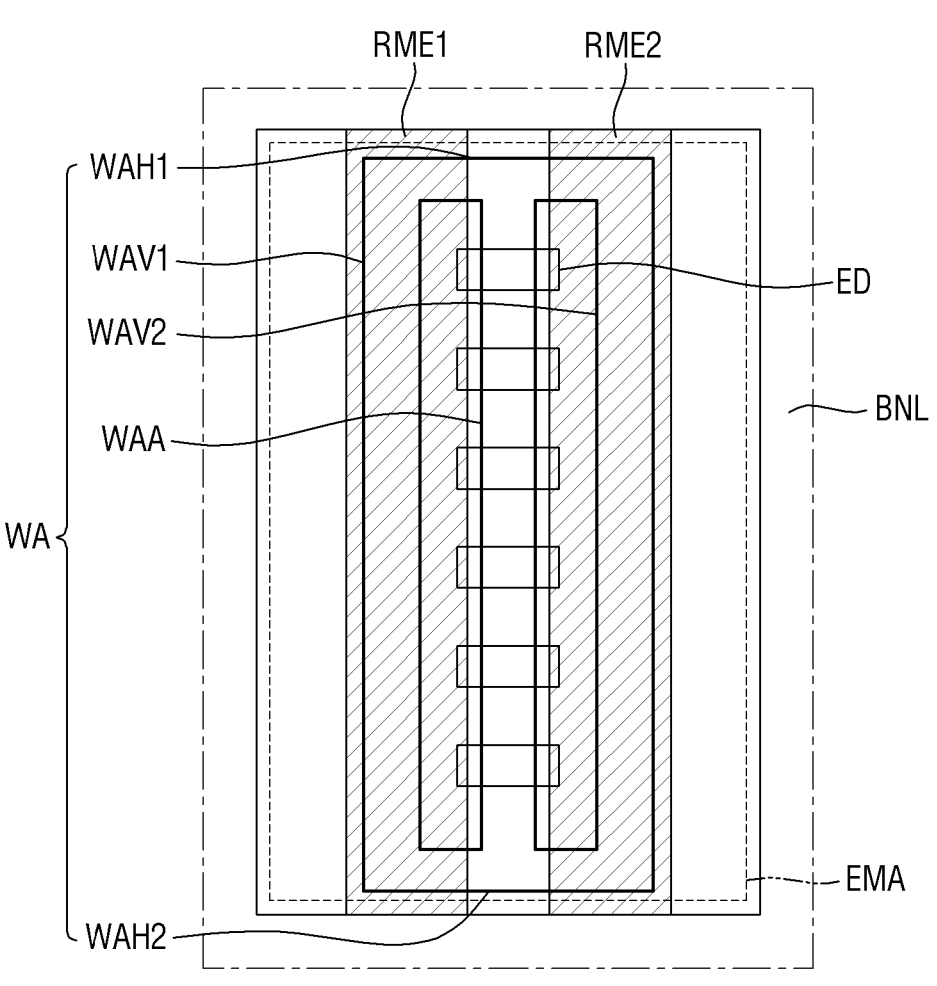

Thereafter, referring to FIGS. 15 and 16, the partition WA is formed by dry-etching the organic material layer 310 using the hard mask 330. The partition WA may include a first part WAA, second parts WAV (e.g., first and second extensions WAV1 and WAV2), and third parts WAH (e.g., first and second connectors WAH1 and WAH2), and the first part WAA, the second parts WAV, and the third parts WAH may be formed at the same time.

As the first part WAA, the second parts WAV, and the third parts WAH of the partition WA are formed by the same mask process, the vertical distances from the top surface of the first electrode RME1 to the top surfaces of the first part WAA, the second parts WAV, and the third parts WAH may be the same. As the partition WA is formed after the alignment of the light-emitting elements ED, the volume of ink that can be applied onto an emission area EMA of a subpixel SPXn can be increased. As a result, the number of light-emitting elements that can be aligned in the emission area EMA can be increased, and thus, luminance can be improved. As the partition WA is formed by dry-etching using the hard mask 330, the partition WA can be formed to have a large tapered angle. In an embodiment, the partition WA may have a tapered angle of about 40° or greater. As the partition WA having various parts is formed by a single mask process, the number of mask processes can be reduced, and the fabrication of a display device can be simplified.

A first connecting electrode CNE1, a second insulating layer PAS2, a second connecting electrode CNE2, and a third insulating layer PAS3 are formed on a target substrate.

Figure 17:
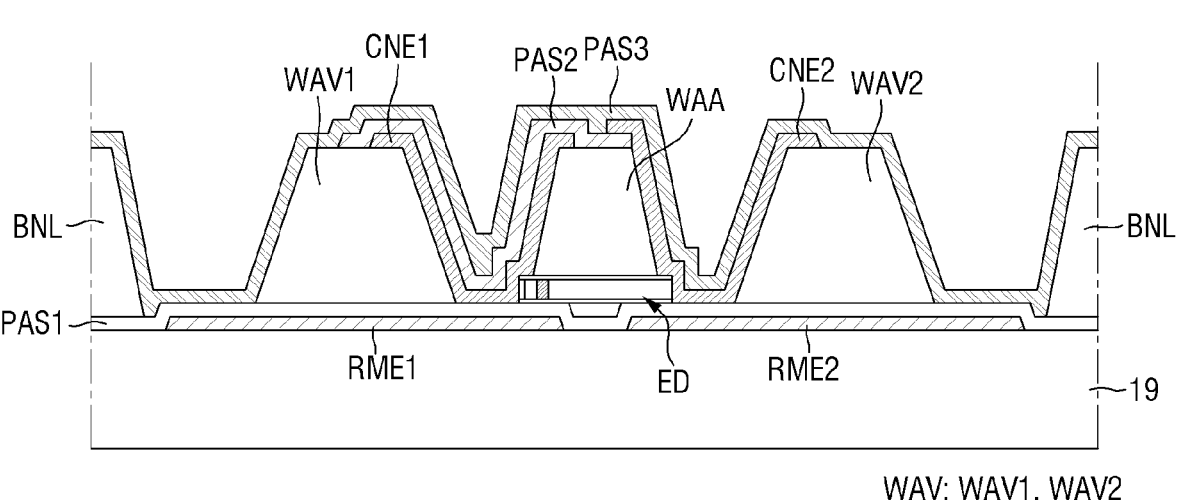

Referring to FIG. 17, the first connecting electrode CNE1 is formed by depositing and patterning an electrode material layer. The first connecting electrode CNE1 may adjoin first end portions of the light-emitting elements ED. Thereafter, the second insulating layer PAS2, which covers the first connecting electrode CNE1 and exposes second end portions of the light-emitting elements ED, is formed by depositing and patterning an insulating material. The second connecting electrode CNE2 is formed by depositing and patterning an electrode material layer. The second connecting electrode CNE2 may adjoin the second end portions of the light-emitting elements ED. Thereafter, the third insulating layer PAS3 is formed. In this manner, a display device 10 can be obtained.

Display devices according to various embodiments will hereinafter be described.

FIG. 18 is a schematic plan view of a subpixel of a display device according to an embodiment. FIG. 19 is a schematic cross-sectional view taken along line Q5-Q5' of FIG. 18. FIG. 20 is a schematic cross-sectional view taken along line Q5-Q5' of FIG. 18. FIG. 21 is a schematic plan view of a subpixel of a display device according to an embodiment. FIG. 22 is a schematic cross-sectional view taken along line Q6-Q6' of FIG. 21.

Referring to FIGS. 18 to 22, a display device 10 may include a partition WA. The embodiment of FIGS. 18 to 22 differs from the embodiment of FIGS. 2 to 9 in that the display device 10 further includes reflective layers RFL. Descriptions of elements or features that have already been described above with reference to FIGS. 2 to 9 will be omitted or simplified. Differences will be mainly described in detail.

Referring to FIGS. 18 and 19, the display device 10 may further include the reflective layers RFL, which are disposed on a partition WA. The reflective layers RFL may be disposed at least on side surfaces of parts of the partition WA. Specifically, the reflective layer RFL may be disposed on side surfaces of first and second extensions WAV1 and WAV2 of the partition WA, which extend in a second direction DR2. The reflective layers RFL may extend in the second direction DR2 and may be spaced apart from each other in a first direction DR1. The reflective layers RFL may be disposed on side surfaces of the first and second extensions WAV1 and WAV2 that are opposite to each other. For example, one of the reflective layers RFL may be disposed on a side surface of the first extension WAV1 adjacent to light-emitting elements ED, and the other reflective layer RFL may be disposed on a side surface of the second extension WAV2 adjacent to the light-emitting elements ED.

The reflective layers RFL may contact connecting electrodes CNE. Specifically, the reflective layer RFL on the side surface of the first extension WAV1 may contact a first connecting electrode CNE1 and the bottom surface of the first connecting electrode CNE1, and the reflective layer RFL on the side surface of the second extension WAV2 may contact a second connecting electrode CNE2 and the bottom surface of the second connecting electrode CNE2. As the reflective layers RFL contact the connecting electrodes CNE, the reflective layers RFL can reduce the resistance of the connecting electrodes CNE.

The reflective layers RFL may contact side surfaces of the first and second extensions WAV1 and WAV2, and end portions of the reflective layers RFL may directly contact a first insulating layer PAS1. Second end portions of the reflective layers RFL may be aligned with the top surfaces of the first and second extensions WAV1 and WAV2. The reflective layers RFL may contact the entire side surfaces of the first and second extensions WAV1 and WAV2, but the disclosure is not limited thereto. As another example, the reflective layers RFL may be disposed only on parts of the side surfaces of the first and second extensions WAV1 and WAV2.

The reflective layers RFL may be formed of a metal with high reflectance such as Al, Ti, or Ni. The reflective layers RFL may be disposed at an inclination along the side surfaces of the first and second extensions WAV1 and WAV2. The reflective layers RFL may surround the light-emitting elements ED in both directions. Thus, luminance can be improved by the reflective layers RFL reflecting light, emitted by the light-emitting elements ED, in an upward direction.

As already mentioned above, as the partition WA is formed by dry etching using a hard mask, the partition WA may have a large tapered angle. Accordingly, the inclination angle of the reflective layers RFL on the side surfaces of the first and second extensions WAV1 and WAV2 can be increased, and as a result, the efficiency of the reflection of light emitted by the light-emitting elements ED can be improved.

As another example, referring to FIG. 20, the reflective layers RFL may extend further toward the light-emitting elements ED. Specifically, the reflective layer RFL on the first extension WAV1 may contact in part the side surface of the first extension WAV1 and may also contact in part the first insulating layer PAS1 to be parallel to a first electrode RME1, and the reflective layer RFL on the second extension WAV2 may contact in part the side surface of the second extension WAV2 and may also contact in part the first insulating layer PAS1 to be parallel to a second electrode RME2.

Parts of the reflective layers RFL that are disposed to be parallel to the first and second electrodes RME1 and RME2 can reflect light, incident thereupon from thereabove, in the upward direction, and can improve luminance. The reflective layers RFL may be spaced from the light-emitting elements ED by a predetermined distance such that first and second connecting electrodes CNE1 and CNE2 may contact both end portions of each of the light-emitting elements ED.

As another example, the reflective layers RFL may be further disposed on side surfaces of third parts WAH of the partition WA, e.g., on side surfaces of first and second connectors WAH1 and WAV2.

Referring to FIGS. 21 and 22, the reflective layers RFL may be disposed on, and extend along, side surfaces of the third parts WAH of the partition WA that extend in the first direction DR1, e.g., the side surfaces of the first and second connectors WAH1 and WAH2. Parts of the reflective layers RFL that are disposed on the side surfaces of the first and second connectors WAH1 and WAH2 may extend in the first direction DR1 and may be spaced apart from each other in the second direction DR2. The reflective layers RFL may be disposed on side surfaces of the first and second connectors WAH1 and WAH2 that are opposite to each other. For example, one of the reflective layers RFL may be disposed on a side surface of the first connector WAH1 adjacent to light-emitting elements ED, and the other reflective layer RFL may be disposed on a side surface of the second connector WAH2 adjacent to the light-emitting elements ED.

One of the reflective layers RFL may overlap the first electrode RME1 and may be electrically connected continuously over the side surfaces of the first connector WAH1, the first extension WAV1, and the second connector WAH2. Another (or the other) reflective layer RFL may overlap the second electrode RME2 and may be connected continuously over the side surfaces of the first connector WAH1, the second extension WAV2, and the second connector WAH2. The reflective layers RFL may be spaced apart from each other by a predetermined distance on the first and second connectors WAH1 and WAH2.

In an embodiment, the reflective layers RFL may be disposed on the side surfaces of the first and second connectors WAH1 and WAH2 and the first and second extensions WAV1 and WAV2 to surround the light-emitting elements ED in four directions. Thus, luminance can be improved by the reflective layers RFL reflecting light, emitted by the light-emitting elements ED, in the upward direction.

FIG. 23 is a schematic plan view of a pixel of a display device according to an embodiment. FIG. 24 is a schematic plan view of a pixel of a display device according to an embodiment.

Referring to FIGS. 23 and 24, a display device 10 may include a partition WA. The embodiment of FIGS. 23 and 24 differs from the embodiments of FIGS. 2 to 9 and 18 to 22 in that third parts WAH of the partition WA, e.g., first and second connectors WAH1 and WAH2, are not provided. Descriptions of elements or features that have already been described above with reference to FIGS. 2 to 9 and 18 to 22 will be omitted or simplified. Differences will be mainly described in detail.

Referring to FIGS. 23 and 24, the partition WA may include second parts WAV, e.g., first and second extensions WAV1 and WAV2, which extend in a second direction DR2 and are spaced from each other in a first direction DR1, and a first part WAA, which is disposed between the first and second extensions WAV1 and WAV2 and extends in the second direction DR2. The first and second extensions WAV1 and WAV2 and the first part WAA may not be electrically connected to one another, but may be separated and spaced apart from one another. The first and second extensions WAV1 and WAV2 and the first part WAA may be the same as their respective counterparts of any of the embodiments of FIGS. 2 to 9 and 18 to 22, and thus, detailed descriptions thereof will be omitted.

The partition WA, unlike its counterpart of any one of the embodiments of FIGS. 2 to 9 and 18 to 22, may not include third parts WAH, which extend in the first direction DR1, and may include the first and second extensions WAV1 and WAV2 and the first part WAA, which extend in the second direction DR2. Thus, the pattern of the partition WA, which is formed at the same time by dry etching, can be improved.

Reflective layers RFL may be disposed on side surfaces of the first and second extensions WAV1 and WAV2 that face each other. As the reflective layers RFL are disposed adjacent to each other with light-emitting elements ED interposed therebetween, the reflective layers RFL can emit light, emitted by the light-emitting elements ED, in an upward direction and can improve luminance.

FIG. 25 is a schematic plan view of a subpixel of a display device according to an embodiment. FIG. 26 is a schematic cross-sectional view taken along line Q7-Q7' of FIG. 25. FIG. 27 is a schematic cross-sectional view taken along line Q8-Q8' of FIG. 25. FIG. 26 illustrates a schematic cross-sectional view taken across both end portions of each of first and second light-emitting elements ED1 and ED2 of FIG. 25, and FIG. 27 illustrates a schematic cross-sectional view taken across first, second, third, and fourth contacts CT1, CT2, CT3, and CT4 of FIG. 25.

Referring to FIGS. 25 to 27, a display device 10 may include a relatively large number of electrodes RME and a relatively large number of connecting electrodes CNE and may also include a relatively large number of light-emitting elements ED in each subpixel SPXn. The embodiment of FIGS. 25 to 27 differs from the embodiments of FIGS. 2 to 9 and 18 to 24 in the layout of electrodes RME and connecting electrodes CNE in each subpixel SPXn and the shape of a partition WA. Descriptions of elements or features that have already been described above with reference to FIGS. 2 to 9 and 18 to 24 will be omitted or simplified. Differences will be mainly described in detail.

The partition WA may include first parts WAA, which overlap light-emitting elements ED, second parts WAV, which are spaced apart from each other with the first parts WAA interposed therebetween, and third parts WAH, which electrically connect the first parts WAA and the second parts WAV.

The first parts WAA may include a first fixer WAA1 which extends in a second direction DR2 and is disposed between some of the second parts WAV, e.g., between a first extension WAV1 and a second extension WAV2, and a second fixer WAA2 which extends in the second direction DR2 and is disposed between some of the second parts WAV, e.g., between the second extension WAV2 and a third extension WAV3. The second parts WAV may electrically connect the third parts WAV, e.g., a first connector WAH1 and a second connector WAH2, and may include the first, second, and third extensions WAV1, WAV2, and WAV3 which extend in the second direction DR2 and are spaced apart from one another in a first direction DR1. The third parts WAH may include the first and second connectors WAH1 and WAH2, which extend in the first direction DR1 and are spaced apart from each other in the second direction DR2.

The first and second connectors WAH1 and WAH2 may have the same structure as their respective counterpart of FIGS. 2 to 9. The first and second connectors WAH1 and WAH2 may be disposed to overlap electrodes RME and connecting electrodes CNE. In an embodiment, the first and second connectors WAH1 and WAH2 may overlap first, second, third, and fourth electrodes RME1, RME2, RME3, and RME4. The first connector WAH1 may overlap a third connector CN_B3 of a fifth connecting electrode CNE5. The second connector WAH2 may overlap first, second, third, and fourth connecting electrodes CNE1, CNE2, CNE3, and CNE4.

The first extension WAV1 may overlap the first electrode RME1 and the first and third connecting electrodes CNE1 and CNE3. The second extension WAV2 may overlap the second and third electrodes RME2 and RME3 and the second, third, fourth, and fifth connecting electrodes CNE2, CNE3, CNE4, and CNE5. The third extension WAV3 may overlap the fourth electrode RME4 and the fourth and fifth connecting electrodes CNE4 and CNE5. For example, the first extension WAV1 may be disposed in a left portion of an emission area EMA, the second extension WAV2 may be disposed in the middle of the emission area EMA, and the third extension WAV3 may be disposed in a right portion of the emission area EMA. The first and second extensions WAV1 and WAV2 may be spaced apart from each other in the first direction DR1 with first light-emitting elements ED1 and third light-emitting elements ED3 interposed therebetween. The second and third extensions WAV2 and WAV3 may be spaced from each other in the first direction DR1 with second light-emitting elements ED2 and fourth light-emitting elements ED4 interposed therebetween.

The first and second fixers WAA1 and WAA2 may extend in the second direction DR2 and may be portions of the first parts WAA that overlap the light-emitting elements ED. The first fixer WAA1 may be disposed directly on the first light-emitting elements ED1 and the third light-emitting elements ED3 to fix and protect the first light-emitting elements ED1 and the third light-emitting elements ED3, and the second fixer WAA2 may be disposed directly on second light-emitting elements ED2 and fourth light-emitting elements ED4 to fix and protect the second light-emitting elements ED2 and the fourth light-emitting elements ED4. The first and second fixers WAA1 and WAA2 may overlap the connecting electrodes CNE. In an embodiment, the first fixer WAA1 may overlap the first, third, and fifth connecting electrodes CNE1, CNE3, and CNE5, and the second fixer WAA2 may overlap the second, fourth, and fifth connecting electrodes CNE2, CNE4, and CNE5.

As the partition WA is disposed on the electrodes RME and the light-emitting elements ED, the volume of ink that can be applied onto the emission area EMA can be increased. As a result, the number of light-emitting elements that can be aligned in the emission area EMA can be increased, and thus, luminance can be improved.

The electrodes RME may include the first and second electrodes RME1 and RME2 and may further include the third and fourth electrodes RME3 and RME4.

The third electrode RME3 may be disposed between the first and second electrodes RME1 and RME2, and the fourth electrode RME4 may be spaced apart from the third electrode RME3 in the first direction DR1 with the second electrode RME2 interposed therebetween. The electrodes RME may be arranged in the order of the first, third, second, and fourth electrodes RME1, RME3, RME2, and RME4 in a left-to-right direction.

The electrodes RME may extend from the emission area EMA to a subarea SA across a bank BNL. The first and second electrodes RME1 and RME2 may be electrically connected to a third conductive layer therebelow through first and second electrode contact holes CTD and CTS. However, the third and fourth electrodes RME3 and RME4 may not be directly connected to the third conductive layer and may be electrically connected to the first and second electrode RME1 and RME2 through the light-emitting elements ED and the connecting electrodes CNE. The first and second electrodes RME1 and RME2 may be first-type electrodes directly connected to the third conductive layer through the first and second electrode contact holes CTD and CTS, and the third and fourth electrodes RME3 and RME4 may be second-type electrodes not directly connected to the third conductive layer. The second-type electrodes may provide electrical connection paths for the light-emitting elements ED, together with the connecting electrodes CNE.

The light-emitting elements ED may be disposed on different electrodes RME. Some of the light-emitting elements ED may be disposed between the first and second extensions WAV1 and WAV2, and some of the light-emitting elements SED may be disposed between the second and third extensions WAV2 and WAV3. The light-emitting elements ED may include the first light-emitting elements ED1 and the third light-emitting elements ED3, which are disposed between the first and second extensions WAV1 and WAV2, and the second light-emitting elements ED2 and the fourth light-emitting elements ED4, which are disposed between the second and third extensions WAV2 and WAV3. The first light-emitting elements ED1 and the third light-emitting elements ED3 may be disposed on the first and third electrodes RME1 and RME3, and the second light-emitting elements ED2 and the fourth light-emitting elements ED4 may be disposed on the second and fourth electrodes RME2 and RME4. The first light-emitting elements ED1 and the second light-emitting elements ED2 may be disposed adjacent to the lower side of the emission area EMA or the subarea SA, and the third light-emitting elements ED3 and the fourth light-emitting elements ED4 may be disposed adjacent to the upper side of the emission area EMA. The light-emitting elements ED may be classified not by their locations in the emission area EMA, but by how they are electrically connected to the connecting electrodes CNE. The set of connecting electrodes CNE to which the light-emitting elements ED are electrically connected may vary depending on the layout of the connecting electrodes CNE, and the light-emitting elements ED may be classified into different groups depending on which of the connecting electrodes CNE are electrically connected thereto.

The connecting electrodes CNE may include the first and second connecting electrodes CNE1 and CNE2, which are disposed on the first and second electrodes RME1 and RME2, respectively, and may further include the third, fourth, and fifth connecting electrodes CNE3, CNE4, and CNE5, and each of the third, fourth, and fifth connecting electrodes CNE3, CNE4, and CNE5 may be disposed on more than one electrode RME.

The first connecting electrode CNE1 and the second connecting electrode CNE2 may extend relatively short in the second direction DR2. The first and second connecting electrodes CNE1 and CNE2 may be disposed on the lower side of the center of the emission area EMA. The first and second connecting electrodes CNE1 and CNE2 may be disposed in and across the emission area EMA and the subarea SA and may contact the first and second electrodes RME1 and RME2, respectively, through the first and second contacts CT1 and CT2, respectively.

The third connecting electrode CNE3 may include a first sub-extension CN_E1 which is disposed on the third electrode RME3, a second sub-extension CN_E2 which is disposed on the first electrode RME1, and a first sub-connector CN_B1, which electrically connects the first and second sub-extensions CN_E1 and CN_E2. The first sub-extension CN_E1 may be spaced apart from, and face, the first connecting electrode CNE1 in the first direction DR1, and the second sub-extension CN_E2 may be spaced apart from, and face, the first connecting electrode CNE1 in the second direction DR2. The first sub-extension CN_E1 may be disposed in the lower part of the emission area EMA, and the second sub-extension CN_E2 may be disposed in the upper part of the emission area EMA. The first sub-extension CN_E1 may be disposed in and across the emission area EMA and the subarea SA and may be electrically connected to the third electrode RME3 through the third contact CT3, which is disposed in the subarea SA. The first sub-connector CN_B1 may be disposed over the first and third electrodes RME1 and RME3, in the middle of the emission area EMA.

The third connecting electrode CNE3 may generally extend in the second direction DR2 and may be bent in the first direction DR1 and then extend back in the second direction DR2.

The fourth connecting electrode CNE4 may include a third sub-extension CN_E3 which is disposed on the fourth electrode RME4, a fourth sub-extension CN_E4 which is disposed on the second electrode RME2, and a second sub-connector CN_B2 which electrically connects the third and fourth sub-extensions CN_E3 and CN_E4. The third sub-extension CN_E3 may be spaced apart from, and face, the second connecting electrode CNE2 in the first direction DR1, and the fourth sub-extension CN_E4 may be spaced apart from, and face, the second connecting electrode CNE2 in the second direction DR2. The third sub-extension CN_E3 may be disposed in the lower part of the emission area EMA, and the fourth sub-extension CN_E4 may be disposed in the upper part of the emission area EMA. The third sub-extension CN_E3 may be disposed in and across the emission area EMA and the subarea SA and may be electrically connected to the fourth electrode RME4 through the fourth contact CT4, which is disposed in the subarea SA. The second sub-connector CN_B2 may be disposed over the second and fourth electrodes RME2 and RME4, near the center of the emission area EMA. The fourth connecting electrode CNE4 may generally extend in the second direction DR2 and may be bent in the first direction DR1 and then extend back in the second direction DR2.

The fifth connecting electrode CNE5 may include a fifth sub-extension CN_E5 which is disposed on the third electrode RME3, a sixth sub-extension CN_E6, which is disposed on the fourth electrode RME4, and a third sub-connector CN_B3, which electrically connects the fifth and sixth sub-extensions CN_E5 and CN_E6. The fifth sub-extension CN_E5 may be spaced apart from, and face, the second sub-extension CN_E2 of the third connecting electrode CNE3 in the first direction DR1, and the sixth sub-extension CN_E6 may be spaced apart from, and face, the fourth sub-extension CN_E4 of the fourth connecting electrode CNE4 in the second direction DR2. The fifth and sixth sub-extensions CN_E5 and CN_E6 may be disposed in the upper part of the emission area EMA, and the third sub-connector CN_B3 may be disposed over the second, third, and fourth electrode RME2, RME3, and RME4. The fifth connecting electrode CNE5 may be disposed to surround the fourth sub-extension CN_E4 of the fourth connecting electrode CNE4 in a plan view.

The first and second connecting electrodes CNE1 and CNE2 may be first-type connecting electrodes electrically connected to the first and second electrodes RME1 and RME2, which are directly connected to the third conductive layer, the third and fourth electrodes RME3 and RME4 may be second-type connecting electrodes electrically connected to the third and fourth electrodes RME3 and RME4, which are not directly connected to the third conductive layer, and the fifth connecting electrode CNE5 may be a third-type connecting electrode electrically disconnected from the electrodes RME.

As described above, the light-emitting elements ED may be classified into different groups depending on which of the connecting electrodes CNE are electrically connected thereto.

The first light-emitting elements ED1 and the second light-emitting elements ED2 may have first end portions thereof contacting the first-type connecting electrodes and second end portions thereof contacting the second-type connecting electrodes. The first light-emitting elements ED1 may contact the first and third connecting electrodes CNE1 and CNE3, and the second light-emitting elements ED2 may contact the second and fourth connecting electrodes CNE2 and CNE4. The third light-emitting elements ED3 and the fourth light-emitting elements ED4 may have first end portions thereof contacting the second-type connecting electrodes and second end portions thereof contacting the third-type connecting electrode. The third light-emitting elements ED3 may contact the third and fifth connecting electrodes CNE3 and CNE5, and the fourth light-emitting elements ED4 may contact the fourth and fifth connecting electrodes CNE4 and CNE5.

The light-emitting elements ED may be electrically connected in series via the connecting electrodes CNE. As a relatively large number of light-emitting elements ED can be provided in each subpixel SPXn, and serial connections can be configured therebetween, the amount of light emitted per unit area of the display device 10 can be further increased.

FIG. 28 is a schematic plan view of a subpixel of a display device according to an embodiment. FIG. 29 is a schematic cross-sectional view taken along line Q9-Q9' of FIG. 28. FIG. 30 is a schematic cross-sectional view taken along line Q10-Q10' of FIG. 28. FIG. 29 illustrates a schematic cross-sectional view taken across both end portions of each of first and second light-emitting elements ED1 and ED2 of FIG. 28, and FIG. 30 illustrates a schematic cross-sectional view taken across first and second contacts CT1 and CT2 of FIG. 28.

Referring to FIGS. 28 to 30, electrodes RME and connecting electrodes CNE of a subpixel SPXn of a display device 10 may differ from their respective counterparts of any of the previous embodiments. A partition WA of the display device 10 and that of FIGS. 25 to 27 may have the same structure, but may have a different layout, relative to the electrodes RME and the connecting electrodes CNE, from the partition WA of FIGS. 25 through 27.

Third parts WAH of the partition WA, e.g., first and second connectors WAH1 and WAH2, may have the same structure as the first and second connectors WAH1 and WAH2 of FIGS. 2 to 9. The first and second connectors WAH1 and WAH2 may overlap the electrodes RME and the connecting electrodes CNE. The first and second connectors WAH1 and WAH2 may overlap first, second, and third electrodes RME1, RME2, and RME3. The first connector WAH1 may overlap first and second connecting electrodes CNE1 and CNE2. The second connector WAH2 may overlap a third connecting electrode CNE3.

A first extension WAV1 of a second part WAV may overlap the second electrode RME2 and the second connecting electrode CNE2. A second extension WAV2 of the second part WAV may overlap the first electrode RME1 and the first connecting electrode CNE1. A third extension WAV3 of the second part WAV may overlap the third electrode RME3 and the third connecting electrode CNE3. For example, the first extension WAV1 may be disposed in a left portion of an emission area EMA, the second extension WAV2 may be disposed in the middle of the emission area EMA, and the third extension WAV3 may be disposed in a right portion of the emission area EMA. The first and second extensions WAV1 and WAV2 may be spaced apart from each other in a first direction DR1 with second light-emitting elements ED2 interposed therebetween, and the second and third extensions WAV2 and WAV3 may be spaced apart from each other in the first direction DR1 with first light-emitting elements ED1 interposed therebetween.

First parts WAA of the partition WA, e.g., first and second fixers WAA1 and WAA2, may extend in a second direction DR2 and may be portions of the partition WA that overlap light-emitting elements ED. The first fixer WAA1 may be disposed directly on the second light-emitting elements ED2 to fix and protect the second light-emitting elements ED2, and the second fixer WAA2 may be disposed directly on the first light-emitting elements ED1 to fix and protect the first light-emitting elements ED1. The first and second fixers WAA1 and WAA2 may overlap the connecting electrodes CNE. In an embodiment, the first fixer WAA1 may overlap the second and third connecting electrodes CNE2 and CNE3, and the second fixer WAA2 may overlap the first and third connecting electrodes CNE1 and CNE3.

As the partition WA is disposed on the electrodes RME and the light-emitting elements ED, the volume of ink that can be applied onto the emission area EMA can be increased. As a result, the number of light-emitting elements that can be aligned in the emission area EMA can be increased, and thus, luminance can be improved.

The electrodes RME may include the first, second, and third electrodes RME1, RME2, and RME3. The first electrode RME1 may be disposed in the middle of the emission area EMA, the second electrode RME2 may be disposed on the left side of the first electrode RME1, and the third electrode RME3 may be disposed on the right side of the first electrode RME1.

The first electrode RME1 may be disposed on the second extension WAV2, the second electrode RME2 may be disposed on the first extension WAV1, and the third electrode RME3 may be disposed on the third extension WAV3. The electrodes RME may be disposed at least on inclined side surfaces of the first, second, and third extensions WAV1, WAV2, and WAV3. The first electrode RME1 may have a larger width than the second extension WAV2 in the first direction DR1, the second electrode RME2 may have a smaller width than the first extension WAV1 in the first direction DR1, and the third electrode RME3 may have a smaller width than the third extension WAV3 in the first direction DR1.

The first and third electrodes RME1 and RME3 may extend in the second direction DR2. In a separation part ROP of a subarea SA of the subpixel SPXn, the first and third electrodes RME1 and RME3 may be spaced apart from first and third electrodes RME1 and RME3 of another subpixel SPXn. The second electrode RME2 may extend in the first direction DR1 across multiple subpixels SPXn arranged in the first direction DR1.

The first electrode RME1 may be electrically connected to a third conductive layer through a first electrode contact hole CTD, which is formed in an area that overlaps a bank BNL. The first electrode RME1 may contact the third conductive layer through the first electrode contact hole CTD, which penetrates a via layer 17, in the area that overlaps the bank BNL on the upper side of the emission area EMA. The location of the first electrode contact hole CTD may differ from one subpixel SPXn to another subpixel SPXn depending on the structure of the third conductive layer in each subpixel SPXn.

The second electrode RME2 may be electrically connected to a second voltage line VL2 through a second electrode contact hole CTS, which penetrates the via layer 17, in the subarea SA on the lower side of the emission area EMA.

The light-emitting elements ED may be disposed on different electrodes RME. The light-emitting elements ED may include the first light-emitting elements ED1, which are disposed on the first and third electrodes RME1 and RME3, and the second light-emitting elements ED2, which are disposed on the first and second electrodes RME1 and RME2. The first light-emitting elements ED1 may be disposed on the right side of the first electrode RME1, and the second light-emitting elements ED2 may be disposed on the left side of the first electrode RME1.

The connecting electrodes CNE may include the first and second connecting electrodes CNE1 and CNE2, which are first-type connecting electrodes, and the third connecting electrode CNE3, which is a second-type connecting electrode.

The first connecting electrode CNE1 may extend in the second direction DR2 and may be disposed on the first electrode RME1. Part of the first connecting electrode CNE1 on the second extension WAV2 may overlap the first electrode RME1 and may extend in the second direction DR2 from the first electrode RME1 beyond the bank BNL to be disposed even in the subarea SA of another subpixel SPXn above the emission area EMA. The first connecting electrode CNE1 may contact the first electrode RME1 through the first contact CT1, in the subarea SA of the subpixel SPXn.

The second connecting electrode CNE2 may extend in the second direction DR2 and may be disposed on the second electrode RME2. Part of the second connecting electrode CNE2 on the first extension WAV1 may overlap the second electrode RME2 and may extend in the second direction DR2 from the second electrode RME2 beyond the bank BNL to be disposed even in the subarea SA of another subpixel SPXn above the emission area EMA. The second connecting electrode CNE2 may contact the second electrode RME2 through the second contact CT2, in the subarea SA of the subpixel SPXn.

The third connecting electrode CNE3 may include first and second sub-extensions CN_E1 and CN_E2, which extend in the second direction DR2, and a first sub-connector CN_B1, which electrically connects the first and second sub-extensions CN_E1 and CN_E2. The first sub-extension CN_E1 may be disposed on the third electrode RME3, in the emission area EMA, and the second sub-extension CN_E2 may be disposed on the first electrode RME1, in the emission area EMA. The first sub-connector CN_B1 may extend in the first direction DR1 on part of the bank BNL below the emission area EMA and may electrically connect the first and second sub-extensions CN_E1 and CN_E2. The third connecting electrode CNE3 may be disposed in the emission area EMA and on the bank BNL and may not be electrically connected to the third electrode RME3.

The third electrode RME3 may be completely covered by the first insulating layer PAS1. The top surface of the third electrode RME3 may not be exposed in the subarea SA, and the third electrode RME3 may be arranged in a floated state where the third electrode RME3 is not electrically connected to the connecting electrodes CNE and the light-emitting elements ED. The first light-emitting elements ED1 and the second light-emitting elements ED2 may be electrically connected in series only through the third connecting electrode CNE3.

The third electrode RME3 may remain floated not to be electrically connected to the connecting electrodes CNE, as illustrated in FIG. 28, but may be electrically connected to another electrode RME adjacent thereto. For example, the third electrode RME3 may be electrically connected to a second electrode RME2 of another subpixel SPXn adjacent to the subpixel SPXn in the first direction DR1, and a second power supply voltage may be applied to the third electrode RME3. Even if the second power supply voltage is applied to the third electrode RME3, the second power supply voltage may not affect the emission of light by the light-emitting elements ED because the third electrode RME3 is not electrically connected to the connecting electrodes CNE. In this case, the third electrode RME3 may branch off of the second electrode RME2 of the neighboring subpixel SPXn, and only the first electrode RME1 may be separated in the separation part ROP of the subarea SA of the subpixel SPXn.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a first electrode and a second electrode disposed on a substrate, the first and second electrodes extending in a direction and being parallel to each other;
a first insulating layer disposed on the first and second electrodes;
light-emitting elements disposed on the first insulating layer, the light-emitting elements having first end portions disposed on the first electrode and second end portions disposed on the second electrode; and
a partition disposed on the first insulating layer and being parallel to the first electrode, the partition including:
a first part that overlaps the light-emitting elements; and
second parts that do not overlap the light-emitting elements,
wherein a vertical distance from a top surface of the first electrode to a top surface of the first part is equal to a vertical distance from the top surface of the first electrode to top surfaces of the second parts, and
wherein the second parts are distinct from the first part.

2. The display device of claim 1, wherein the second parts include:
a first extension; and
a second extension, wherein
the light-emitting elements are disposed between the first and second extensions.

3. The display device of claim 2, wherein the first part is disposed between the first and second extensions.

4. The display device of claim 2, wherein
the first extension overlaps the first electrode, and the second extension overlaps the second electrode.

5. The display device of claim 1, wherein the first part and the second parts intersect a direction in which the light-emitting elements extend.

6. The display device of claim 1, wherein the partition further includes third parts that extend in a direction that intersects the first electrode and connect the first part and the second parts.

7. A display device comprising:
a first electrode and a second electrode disposed on a substrate, the first and second electrodes extending in a direction and being parallel to each other;
a first insulating layer disposed on the first and second electrodes;
light-emitting elements disposed on the first insulating layer, the light-emitting elements having first end portions disposed on the first electrode and second end portions disposed on the second electrode; and
a partition disposed on the first insulating layer and being parallel to the first electrode, the partition including:
a first part that overlaps the light-emitting elements; and
second parts that do not overlap the light-emitting elements,
wherein a vertical distance from a top surface of the first electrode to a top surface of the first part is equal to a vertical distance from the top surface of the first electrode to top surfaces of the second parts,
wherein the partition further includes third parts that extend in a direction that intersects the first electrode and connect the first part and the second parts, and
wherein the third parts include:
a first connector disposed on a side of the first part; and
a second connector disposed on another side of the first part.

8. The display device of claim 7, wherein the first and second connectors are arranged parallel to a direction in which the light-emitting elements extend, and do not overlap the light-emitting elements.

9. A display device comprising:
a first electrode and a second electrode disposed on a substrate, the first and second electrodes extending in a direction and being parallel to each other;
a first insulating layer disposed on the first and second electrodes;
light-emitting elements disposed on the first insulating layer, the light-emitting elements having first end portions disposed on the first electrode and second end portions disposed on the second electrode; and
a partition disposed on the first insulating layer and being parallel to the first electrode, the partition including:
a first part that overlaps the light-emitting elements;
second parts that do not overlap the light-emitting elements; and
a bank disposed on the first insulating layer and partitioning an emission area in which the light-emitting elements are disposed,
wherein a vertical distance from a top surface of the first electrode to a top surface of the first part is equal to a vertical distance from the top surface of the first electrode to top surfaces of the second parts.

10. The display device of claim 9, wherein the partition is disposed in the emission area and does not overlap the bank.

11. The display device of claim 9, wherein the vertical distance from the top surface of the first electrode to the top surface of the first part is equal to a vertical distance from the top surface of the first electrode to a top surface of the bank.

12. The display device of claim 9, wherein the vertical distance from the top surface of the first electrode to the top surface of the first part is greater than the vertical distance from the top surface of the first electrode to the top surface of the bank.

13. The display device of claim 9, wherein the bank and the first part and the second parts of the partition are disposed directly on the first insulating layer and contact the first insulating layer.

* * * * *